United States Patent
Topping et al.

(10) Patent No.: US 12,217,985 B2
(45) Date of Patent: Feb. 4, 2025

(54) WAFER PLACEMENT CORRECTION IN INDEXED MULTI-STATION PROCESSING CHAMBERS

(71) Applicant: Lam Research Corporation, Fremont, CA (US)

(72) Inventors: Stephen Topping, Portland, OR (US); Dong Niu, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 401 days.

(21) Appl. No.: 17/593,791

(22) PCT Filed: Mar. 27, 2020

(86) PCT No.: PCT/US2020/025389
§ 371 (c)(1),
(2) Date: Sep. 24, 2021

(87) PCT Pub. No.: WO2020/205586
PCT Pub. Date: Oct. 8, 2020

(65) Prior Publication Data
US 2022/0172967 A1    Jun. 2, 2022

Related U.S. Application Data

(60) Provisional application No. 62/826,761, filed on Mar. 29, 2019.

(51) Int. Cl.
*H01L 21/67* (2006.01)
*H01L 21/677* (2006.01)
*H01L 21/687* (2006.01)

(52) U.S. Cl.
CPC .. *H01L 21/67196* (2013.01); *H01L 21/67742* (2013.01); *H01L 21/6875* (2013.01); *H01L 21/68764* (2013.01); *H01L 21/68771* (2013.01)

(58) Field of Classification Search
CPC ......... H01L 21/67196; H01L 21/67742; H01L 21/6875; H01L 21/68764; H01L 21/68771;
(Continued)

(56) References Cited

U.S. PATENT DOCUMENTS

| 4,819,167 A | 4/1989 | Cheng et al. |
| 5,001,327 A | 3/1991 | Hirasawa et al. |

(Continued)

FOREIGN PATENT DOCUMENTS

| CN | 101154610 A | 4/2008 |
| CN | 101911276 A | 12/2010 |

(Continued)

OTHER PUBLICATIONS

Co-pending U.S. Appl. No. 17/629,752, filed Jan. 24, 2022.
(Continued)

*Primary Examiner* — Saul Rodriguez
*Assistant Examiner* — Lucia Elba Rodriguez
(74) *Attorney, Agent, or Firm* — Weaver Austin Villeneuve & Sampson LLP

(57) ABSTRACT

Systems and techniques for determining and using multiple types of offsets for providing wafers to a transfer pedestal of a multi-station processing chamber are disclosed. Such techniques may be used to provide pedestal-specific offsets that may be selected based on which pedestal of a multi-station chamber is assigned to a particular wafer. Similar techniques may be used to provide wafer support-specific offsets based on which indexer arm of an indexer is assigned to a given wafer.

21 Claims, 22 Drawing Sheets

(58) Field of Classification Search
CPC ............ H01L 21/67748; H01L 21/68; H01L 21/67259; H01L 21/6719
See application file for complete search history.

(56) References Cited

U.S. PATENT DOCUMENTS

| | | | |
|---|---|---|---|
| 5,483,138 | A | 1/1996 | Shmookler et al. |
| 5,563,798 | A | 10/1996 | Berken et al. |
| 5,564,889 | A | 10/1996 | Araki |
| 5,706,201 | A | 1/1998 | Andrews |
| 5,855,465 | A | 1/1999 | Boitnott et al. |
| 5,855,681 | A * | 1/1999 | Maydan ............ H01L 21/67742 204/298.25 |
| 6,195,619 | B1 | 2/2001 | Ren |
| 6,198,976 | B1 | 3/2001 | Sundar et al. |
| 6,315,512 | B1 | 11/2001 | Tabrizi et al. |
| 6,315,878 | B1 | 11/2001 | Patadia et al. |
| 6,405,101 | B1 | 6/2002 | Johanson et al. |
| 6,430,468 | B1 * | 8/2002 | Tepman ............ H01L 21/67751 700/218 |
| 6,478,532 | B1 | 11/2002 | Coady et al. |
| 6,508,883 | B1 | 1/2003 | Tanguay |
| 6,568,552 | B1 | 5/2003 | Tabrizi et al. |
| 6,610,150 | B1 | 8/2003 | Savage et al. |
| 6,678,581 | B2 | 1/2004 | Hung et al. |
| 6,760,976 | B1 | 7/2004 | Martinson et al. |
| 7,008,802 | B2 | 3/2006 | Lu |
| 7,357,842 | B2 | 4/2008 | Ishikawa et al. |
| 7,658,586 | B2 | 2/2010 | Niewmierzycki et al. |
| 7,694,647 | B2 | 4/2010 | Ishikawa et al. |
| 7,743,728 | B2 | 6/2010 | Ishikawa et al. |
| 7,925,377 | B2 | 4/2011 | Ishikawa et al. |
| 7,933,665 | B2 | 4/2011 | Sakiya et al. |
| 8,060,252 | B2 | 11/2011 | Gage et al. |
| 8,225,683 | B2 | 7/2012 | Bailey, III |
| 8,293,071 | B2 | 10/2012 | Lee |
| 8,489,237 | B2 | 7/2013 | Gage et al. |
| 9,002,514 | B2 | 4/2015 | Genetti et al. |
| 9,163,928 | B2 | 10/2015 | Tang et al. |
| 9,892,956 | B1 | 2/2018 | Konkola et al. |
| 9,960,068 | B1 | 5/2018 | Konkola et al. |
| 10,109,517 | B1 | 10/2018 | Blank et al. |
| 10,796,940 | B2 | 10/2020 | Thaulad et al. |
| 11,581,214 | B2 | 2/2023 | Thaulad et al. |
| 2001/0020199 | A1 | 9/2001 | Bacchi et al. |
| 2002/0053509 | A1 | 5/2002 | Hanson et al. |
| 2002/0098072 | A1 | 7/2002 | Sundar |
| 2003/0135302 | A1 | 7/2003 | Hung et al. |
| 2003/0202865 | A1 | 10/2003 | Ponnekanti et al. |
| 2004/0031340 | A1 | 2/2004 | Renken |
| 2004/0067127 | A1 | 4/2004 | Hofmeister et al. |
| 2004/0129940 | A1 | 7/2004 | Iwase et al. |
| 2004/0151574 | A1 | 8/2004 | Lu |
| 2004/0258514 | A1 | 12/2004 | Raaijmakers |
| 2005/0137751 | A1 | 6/2005 | Cox et al. |
| 2005/0145879 | A1 | 7/2005 | Nakayama et al. |
| 2005/0220576 | A1 | 10/2005 | Kim et al. |
| 2005/0265814 | A1 | 12/2005 | Coady |
| 2006/0020367 | A1 | 1/2006 | Nangoy |
| 2006/0039781 | A1 | 2/2006 | Niewmierzycki et al. |
| 2006/0045664 | A1 | 3/2006 | Niewmierzycki et al. |
| 2006/0182538 | A1 * | 8/2006 | Lee .................. H01L 21/67167 414/217 |
| 2008/0152463 | A1 | 6/2008 | Chidambaram et al. |
| 2008/0319559 | A1 | 12/2008 | De Ridder et al. |
| 2009/0142163 | A1 | 6/2009 | Genetti et al. |
| 2009/0143911 | A1 | 6/2009 | Gage et al. |
| 2010/0228374 | A1 | 9/2010 | Pike |
| 2010/0278623 | A1 | 11/2010 | Blank et al. |
| 2012/0014773 | A1 | 1/2012 | Gage et al. |
| 2012/0022827 | A1 | 1/2012 | Hertgens et al. |
| 2012/0224945 | A1 | 9/2012 | Douki et al. |
| 2014/0271051 | A1 | 9/2014 | Hiroki |
| 2014/0365011 | A1 | 12/2014 | Hosek et al. |
| 2015/0114292 | A1 | 4/2015 | Haverkamp et al. |
| 2015/0249028 | A1 | 9/2015 | Genetti et al. |
| 2016/0126128 | A1 | 5/2016 | Bonora et al. |
| 2016/0358808 | A1 | 12/2016 | Madsen et al. |
| 2017/0004987 | A1 | 1/2017 | Fairbairn |
| 2017/0018446 | A1 | 1/2017 | Yin et al. |
| 2017/0032510 | A1 * | 2/2017 | Francken ............ G06T 7/0004 |
| 2018/0151407 | A1 | 5/2018 | Stone |
| 2018/0158716 | A1 | 6/2018 | Konkola et al. |
| 2018/0211864 | A1 | 7/2018 | Nordin et al. |
| 2019/0172738 | A1 * | 6/2019 | Hiester ............ H01L 21/67201 |
| 2020/0144097 | A1 * | 5/2020 | Blank ............... H01L 21/67706 |
| 2022/0028714 | A1 | 1/2022 | Thaulad et al. |
| 2022/0254666 | A1 | 8/2022 | Sadeghi et al. |

FOREIGN PATENT DOCUMENTS

| | | |
|---|---|---|
| CN | 102017121 A | 4/2011 |
| CN | 102203919 A | 9/2011 |
| CN | 102017121 B | 1/2013 |
| CN | 105762089 A | 7/2016 |
| CN | 106030775 A | 10/2016 |
| CN | 106468541 A | 3/2017 |
| CN | 106773542 A | 5/2017 |
| EP | 0288233 A2 | 10/1988 |
| EP | 1925577 A1 | 5/2008 |
| JP | H10340940 A | 12/1998 |
| JP | 2002280282 A | 9/2002 |
| JP | 3560823 B2 | 9/2004 |
| JP | 2007227953 A | 9/2007 |
| KR | 19990030721 A | 5/1999 |
| KR | 20020095371 A | 12/2002 |
| KR | 20050072349 A | 7/2005 |
| KR | 20050072621 A | 7/2005 |
| KR | 20050092278 A | 9/2005 |
| KR | 100595135 B1 | 6/2006 |
| KR | 100676823 B1 | 2/2007 |
| KR | 100701080 B1 | 3/2007 |
| KR | 200436002 Y1 | 4/2007 |
| KR | 20090045504 A | 5/2009 |
| KR | 20160144727 A | 12/2016 |
| KR | 20190041126 A | 4/2019 |
| TW | 200731452 A | 8/2007 |
| TW | 201713471 A | 4/2017 |
| WO | WO-2014069291 A1 | 5/2014 |
| WO | WO-2021022291 A1 | 2/2021 |

OTHER PUBLICATIONS

International Preliminary Report on Patentability dated Feb. 10, 2022 issued in Application No. PCT/US2020/070300.
International Preliminary Report on Patentability dated May 20, 2021 issued in Application No. PCT/US2019/059261.
International Preliminary Report on Patentability dated Oct. 14, 2021, in application No. PCT/US2020/025389.
International Search Report and Written Opinion dated Feb. 25, 2020 issued in Application No. PCT/US2019/059261.
International Search Report and Written Opinion dated Jul. 23, 2020 issued in Application No. PCT/US2020/025389.
International Search Report and Written Opinion dated Nov. 4, 2020 issued in Application No. PCT/US2020/070300.
US Ex Parte Quayle dated Apr. 17, 2020 issued in U.S. Appl. No. 16/180,691.
U.S. Notice of Allowance dated Jun. 7, 2022 in U.S. Appl. No. 17/309,180.
US Notice of Allowance dated Jun. 29, 2020 issued in U.S. Appl. No. 16/180,691.
Chinese First Office Action, dated Dec. 2, 2011, issued in Application No. 200810178495.1.
Chinese Second Office Action, dated Nov. 26, 2012, issued in Application No. 200810178495.1.
Chinese Third Office Action, dated Mar. 11, 2013, issued in Application No. 200810178495.1.
Korean Final Office Action dated Jan. 27, 2016 issued in KR 10-2015-0082832.
Korean Office Action dated Mar. 11, 2015 issued in KR 10-2008-0119291.

(56) References Cited

OTHER PUBLICATIONS

Korean Office Action dated Sep. 22, 2015 issued in KR 10-2015-0082832.
US Final Office Action, dated Dec. 23, 2011, issued in U.S. Appl. No. 11/998,857.
US Notice of Allowance, dated Dec. 3, 2014, issued in U.S. Appl. No. 11/998,857.
US Notice of Allowance, dated Jun. 29, 2016, issued in U.S. Appl. No. 14/636,558.
US Notice of Allowance, dated Mar. 15, 2013, issued in U.S. Appl. No. 13/243,906.
US Notice of Allowance, dated Sep. 19, 2011, issued in U.S. Appl. No. 11/998,858.
US Notice of Allowance [Supplemental Notice of Allowability], dated Jan. 27, 2015, issued in U.S. Appl. No. 11/998,857.
US Office Action, dated Apr. 15, 2011, issued in U.S. Appl. No. 11/998,858.
US Office Action, dated Dec. 2, 2015, issued in U.S. Appl. No. 14/636,558.
US Office Action, dated Jun. 24, 2011, issued in U.S. Appl. No. 11/998,857.
US Office Action, dated Nov. 14, 2012, issued in U.S. Appl. No. 13/243,906.
CN Office Action dated Oct. 11, 2023 in Application No. CN202080066598.8 with English translation.
International Search Report and Written Opinion dated Feb. 16, 2023 in PCT Application No. PCT/US2022/047055.
SG Office Action dated Jul. 21, 2023, in application No. SG11202110712S.
TW Office Action dated Jul. 17, 2023, in Application No. TW109110402 with English translation.
TW Office Action dated Jul. 31, 2023 in Application No. TW108139880 with English Translation.
U.S. Notice of Allowance dated Oct. 12, 2022, in U.S. Appl. No. 17/309,180.
CN Office Action dated Apr. 25, 2024 in CN Application No. 201980088012.5 with English translation.
CN Office Action dated Mar. 19, 2024 in CN Application No. 202080066598.8 with English translation.
International Preliminary Report on Patentability and Written Opinion dated May 2, 2024 in PCT Application No. PCT/US2022/047055.
U.S. Restriction Requirement dated Apr. 19, 2024 in U.S. Appl. No. 17/629,752.

\* cited by examiner

WAFER PLACEMENT CORRECTION IN INDEXED MULTI-STATION PROCESSING CHAMBERS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes

BACKGROUND

Semiconductor processing tools typically have one or more chambers, each including one or more stations. Each station may have a pedestal for supporting a wafer thereupon during semiconductor processing operations. In some semiconductor processing tools, a single chamber may include a plurality of stations/pedestals. Such multi-station chambers may include, in some instances, a rotational indexer which can be used to transfer wafers from station/pedestal to station/pedestal within the chamber in between various semiconductor processing operations.

An indexer typically includes a center hub and a plurality of equal-length indexer arms. A proximal end of each indexer arm is generally connected with the central hub and a wafer support is typically located at a distal end of each indexer arm; the indexer arms are generally evenly spaced around the center hub. A rotational drive system may be provided to cause the center hub and the indexer arms and wafer supports attached thereto to rotate about a common rotational axis.

In a multi-station chamber with an indexer, the stations/pedestals of the chamber may be arranged in a circular array around the rotational axis of the indexer such that each indexer arm may be simultaneously positioned over one of the stations/pedestals when the center hub of the indexer is rotated into any of a first set of angular positions and simultaneously positioned in between two adjacent stations/pedestals when the center hub of the indexer is rotated into any of a second set of angular positions. During semiconductor processing operations, the indexer may be rotated into one of the angular positions in the second set of angular positions, thereby stowing each indexer arm in between adjacent pairs of stations/pedestals. When semiconductor operations are completed, the wafers may be lifted off their respective pedestals by, for example, lift pins that extend out from the pedestals, and the indexer then rotated into one of the angular positions in the first set of angular positions to position each wafer support at the distal end of each indexer arm under a corresponding one of the lifted wafers. The lift pins may then be retracted into their respective pedestals, thereby lowering each wafer onto the wafer support of the indexer arm located beneath each wafer. The indexer may then be rotated so as to position each wafer above another of the pedestals, at which point the lift pins of the pedestals may be extended again to lift the wafers off of the wafer supports of the indexer arms. The indexer may then be rotated again into one of the angular positions of the second set of angular positions and the lift pins retracted to lower the wafers onto their respective pedestals.

The present disclosure is directed at new systems and techniques for improving wafer processing uniformity in multi-station processing chambers.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some implementations, an apparatus may be provided that includes a first chamber having an indexer and N pedestals in a circular array centered around a rotational axis of the indexer. A pedestal of the N pedestals of the first chamber may be a transfer pedestal, each pedestal of the first chamber may be configured to support a wafer, N may be an integer greater than one, the first chamber may include an active wafer centering system associated with the transfer pedestal, and the first chamber may be a multi-station semiconductor processing chamber. The apparatus may further include a wafer handling robot having a robot arm configured to provide individual wafers to the transfer pedestal of the first chamber, as well as a controller that includes one or more processors and one or more memory devices. The one or more processors, the one or more memory devices, the wafer handling robot, the indexer of the first chamber, and the active wafer centering system of the first chamber may be operably connected with each other, and the one or more memory devices may store computer-executable instructions for controlling the one or more processors to: a) select one of the N pedestals of the first chamber as a destination pedestal of the first chamber for a first wafer; b) select a first pedestal offset associated with the destination pedestal of the first chamber from a set of N pedestal offsets of the first chamber, each pedestal offset of the set of N pedestal offsets of the first chamber associated with a different pedestal of the N pedestals of the first chamber; c) obtain information from the active wafer centering system of the first chamber indicative of a horizontal location of the center of the first wafer; d) determine a first end effector offset associated with the first wafer based, at least in part, on the information obtained from the active wafer centering system of the first chamber indicative of the horizontal location of the center of the first wafer; and e) cause the robot arm to provide the first wafer to the transfer pedestal of the first chamber based on the first pedestal offset and the first end effector offset.

In some implementations of the apparatus, the first chamber, the one or more processors, and the one or more memory devices may be operably connected with each other, and the one or more memory devices may store additional computer-executable instructions for further controlling the one or more processors to cause: f) the indexer of the first chamber to move the first wafer from the transfer pedestal of the first chamber to the destination pedestal of the first chamber; and g) the first chamber to perform one or more semiconductor processing operations on the first wafer on the destination pedestal of the first chamber.

In some implementations of the apparatus, the first chamber, the one or more processors, and the one or more memory devices may be operably connected with each other, the transfer pedestal of the first chamber may be the destination pedestal of the first chamber, and the one or more memory devices may store additional computer-executable instructions for further controlling the one or more processors to cause the first chamber to process the first wafer while the first wafer is on the destination pedestal of the first chamber.

In some implementations of the apparatus, the first chamber, the one or more processors, and the one or more memory devices may be operably connected with each other, and the one or more memory devices may store additional computer-executable instructions for further controlling the one or more processors to: perform (a) through (e) for each of N wafers, wherein a different pedestal of the N pedestals of the first chamber is selected as the destination pedestal of the first chamber for each of the N wafers; cause the indexer of the first chamber to move each wafer of the first through $M^{th}$ wafers of the N wafers to the destination pedestal of the first chamber selected for each wafer of the first through $M^{th}$ wafers, wherein M=N−1 and the transfer pedestal of the first chamber is the destination pedestal of the first chamber for the Nth wafer; and cause the first chamber to perform one or more semiconductor processing operations on the N wafers while each wafer of the N wafers is supported by the corresponding destination pedestal of the first chamber.

In some implementations of the apparatus, the one or more memory devices may store additional computer-executable instructions for further controlling the one or more processors to, for each pedestal of the N pedestals of the first chamber: obtain the pedestal offset associated with the pedestal of the first chamber; and store the pedestal offset associated with the pedestal of the first chamber in a data structure that associates each pedestal offset with the corresponding pedestal of the N pedestals of the first chamber.

In some implementations of the apparatus, N may equal four.

In some implementations of the apparatus, the one or more memory devices may store additional computer-executable instructions for further controlling the one or more processors to: f) select one of the N pedestals of the first chamber as a destination calibration pedestal of the first chamber for a first calibration wafer; g) obtain information from the active wafer centering system indicative of a horizontal location of the center of the first calibration wafer; h) cause the robot arm to provide the first calibration wafer to the transfer pedestal of the first chamber; i) cause the first chamber to perform a calibration process that includes performing one or more semiconductor processing operations on the first calibration wafer; and j) obtain a preliminary pedestal offset for the destination calibration pedestal of the first chamber based, at least in part, on information indicative of non-uniformity of the first calibration wafer resulting from the performance of the calibration process in (i) and the horizontal location of the center of the first calibration wafer.

In some implementations of the apparatus, the one or more memory devices may store additional computer-executable instructions for further controlling the one or more processors to cause the indexer of the first chamber to move the first calibration wafer from the transfer pedestal of the first chamber to the destination calibration pedestal of the first chamber in between the performance of (h) and (i).

In some implementations of the apparatus, the one or more memory devices may store additional computer-executable instructions for further controlling the one or more processors to use the preliminary pedestal offset as the pedestal offset for the destination calibration pedestal of the first chamber.

In some implementations of the apparatus, the one or more memory devices may store additional computer-executable instructions for further controlling the one or more processors to: k) obtain information from the active wafer centering system associated with the transfer pedestal of the first chamber indicative of a horizontal location of the center of a second calibration wafer; l) cause the robot arm to provide the second calibration wafer to the transfer pedestal of the first chamber; m) cause the first chamber to perform the calibration process on the second calibration wafer; and n) determine the pedestal offset for the destination calibration pedestal based at least in part on information indicative of non-uniformity of the second calibration wafer, the information indicative of non-uniformity of the first calibration wafer, the horizontal location of the center of the first calibration wafer, and the horizontal location of the center of the second calibration wafer.

In some implementations of the apparatus, the one or more memory devices may store additional computer-executable instructions for further controlling the one or more processors to: determine a process condition for the chamber and perform (b) by selecting the first pedestal offset associated with the destination pedestal of the first chamber from a set of N pedestal offsets of the first chamber that is associated with the process condition, wherein there are multiple sets of N pedestal offsets of the first chamber, each associated with a different process condition.

In some implementations of the apparatus, one of the N pedestals of the first chamber may be a secondary transfer pedestal, the first chamber may include a secondary active wafer centering system associated with the secondary transfer pedestal, the wafer handling robot may have an additional robot arm configured to provide individual wafers to the secondary transfer pedestal of the first chamber; and the one or more memory devices may store additional computer-executable instructions for further controlling the one or more processors to: f) select one of the N pedestals of the first chamber as a destination pedestal of the first chamber for an additional wafer; g) select a corresponding pedestal offset associated with the destination pedestal of the first chamber from N second pedestal offsets of the first chamber, each pedestal offset of the first chamber associated with a different pedestal of the N pedestals of the first chamber; h) obtain information from the secondary active wafer centering system of the first chamber indicative of a horizontal location of the center of the additional wafer; i) determine a second end effector offset associated with the additional wafer based, at least in part, on the information obtained from the secondary active wafer centering system of the first chamber indicative of the horizontal location of the center of the additional wafer; and j) cause the additional robot arm to provide the additional wafer to the secondary transfer pedestal of the first chamber based on the pedestal offset and the second end effector offset.

In some implementations of the apparatus, the apparatus may further include a second chamber having an indexer and R pedestals in a circular array centered around a rotational axis of the indexer. In such an implementations, one of the R pedestals of the second chamber may be a transfer pedestal of the second chamber, each pedestal of the second chamber may be configured to support a wafer, R may be an integer greater than one, the second chamber may include an active wafer centering system associated with the transfer pedestal of the second chamber, and the second chamber may be a multi-station semiconductor processing chamber. Additionally, the one or more processors, the one or more memory devices, the wafer handling robot, the indexer of the second chamber, and the active wafer centering system of the second chamber may be operably connected with each other, and the one or more memory devices may store additional computer-executable instructions for further controlling the one or more processors to: f) select one of the R pedestals of the second chamber as a destination pedestal of the second chamber for an additional wafer; g) select a corresponding second pedestal offset associated with the destination pedestal of the second chamber from a set of R second pedestal offsets of the second chamber, each second pedestal offset of the second chamber associated with a different pedestal of the R pedestals of the second chamber; h) obtain information from the active wafer centering system of the second chamber indicative of a horizontal location of the center of the additional wafer; i) determine a second end effector offset associated with the additional wafer based, at least in part, on the information obtained from the active wafer centering system of the second chamber indicative of the horizontal location of the center of the additional wafer; and j) cause the robot arm to provide the additional wafer to the transfer pedestal of the second chamber based on the second pedestal offset and the second end effector offset.

In some implementations of the apparatus, the indexer arm may include a plurality of indexer arms, each indexer arm may be connected to a center hub of the indexer at one end and has a wafer support at the other end that is configured to rotate about a corresponding rotational axis relative to that indexer, and the one or more memory devices may store additional computer-executable instructions for further controlling the one or more processors to: f) select a wafer support from the plurality of wafer supports supported by the indexer arms as a destination wafer support of the first chamber for a second wafer; g) select a first wafer support offset associated with the destination wafer support of the first chamber from a set of N wafer support offsets, each wafer support offset associated with a different wafer support of the plurality of wafer supports; h) obtain information from the active wafer centering system of the first chamber indicative of the horizontal location of the center of the second wafer; i) determine a first end effector offset associated with the second wafer based, at least in part, on the information obtained from the active wafer centering system of the first chamber indicative of the horizontal location of the center of the second wafer; and j) cause the wafer handling robot to provide the second wafer to the transfer pedestal of the first chamber based at least in part on the first wafer support offset and the first end effector offset.

In some implementations, an apparatus may be provided that includes a first chamber having an indexer and N pedestals in a circular array centered around a rotational axis of the indexer. A pedestal of the N pedestals of the first chamber may be a transfer pedestal, each pedestal of the first chamber may be configured to support a wafer, N may be an integer greater than one, the first chamber may include an active wafer centering system associated with the transfer pedestal, the first chamber may be a multi-station semiconductor processing chamber, and the indexer may have N indexer arms, each indexer arm having i) a proximal end connected with a central hub configured to rotate about a first axis and ii) a distal end supporting a wafer support that is configured to rotate about a corresponding second axis relative to that indexer arm. The apparatus may further include a wafer handling robot having a robot arm configured to provide individual wafers to the transfer pedestal of the first chamber and a controller that includes one or more processors and one or more memory devices. The one or more processors, the one or more memory devices, the wafer handling robot, the indexer of the first chamber, and the active wafer centering system of the first chamber may be operably connected with each other, and the one or more memory devices may store computer-executable instructions for controlling the one or more processors to: a) select a wafer support from the plurality of wafer supports supported by the indexer arms as a destination wafer support of the first chamber for a first wafer; b) select a first wafer support offset associated with the destination wafer support of the first chamber from a set of N wafer support offsets, each wafer support offset associated with a different wafer support of the plurality of wafer supports; c) obtain information from the active wafer centering system of the first chamber indicative of a horizontal location of the center of the first wafer; d) determine a first end effector offset associated with the first wafer based, at least in part, on the information obtained from the active wafer centering system of the first chamber indicative of the horizontal location of the center of the first wafer; and e) cause the wafer handling robot to provide the first wafer to the transfer pedestal of the first chamber based at least in part on the first wafer support offset and the first end effector offset.

In some implementations of the apparatus, the one or more memory devices may store additional computer-executable instructions for further controlling the one or more processors to: f) cause, after (e), the indexer to rotate such that the corresponding second axis of the destination wafer support is aligned with the center of the first wafer, g) cause the first wafer to be placed on the destination wafer support with the center of the first wafer aligned with the second axis of the destination wafer support, h) cause the indexer to rotate, after (g), to move the first wafer from a station of the first chamber having the transfer pedestal to another station of the first chamber having a pedestal other than the transfer pedestal, i) cause the first wafer to be placed on the pedestal of the other station, j) cause the wafer support for the first wafer to rotate about the corresponding second axis relative to the indexer arm supporting the wafer support in between (g) and (i), and k) cause the first chamber to perform one or more semiconductor processing operations on the first wafer while the first wafer is on the pedestal of the other station.

In some implementations of the apparatus, the one or more memory devices may store additional computer-executable instructions for further controlling the one or more processors to, for each wafer of second through Nth wafers: f) select a wafer support from the plurality of wafer supports supported by the indexer arms as a destination wafer support of the first chamber for that wafer; g) select a corresponding wafer support offset associated with the destination wafer support of the first chamber for that wafer from the set of N wafer support offsets; h) obtain information from the active wafer centering system of the first chamber indicative of a horizontal location of a center of that wafer; i) determine a corresponding end effector offset for that wafer based, at least in part, on the information obtained from the active wafer centering system of the first chamber indicative of the horizontal location of the center of that wafer; j) cause the wafer handling robot to provide that wafer to the transfer pedestal of the first chamber based at least in part on the corresponding wafer support offset for that wafer and the corresponding end effector offset for that wafer; k) cause, after (j), the indexer to rotate such that the corresponding second axis of the destination wafer support for that wafer is aligned with the center of that wafer; and l) cause that wafer to be placed on the destination wafer support for that wafer with the center of that wafer aligned with the second axis of the destination wafer support for that wafer.

In some implementations of the apparatus, each pedestal of the first chamber may be associated with a corresponding station of the first chamber, and the one or more memory devices may store additional computer-executable instructions for further controlling the one or more processors to: (m) cause, after (l), the indexer to move, in unison, each of the N wafers from the station of the first chamber that each wafer of the N wafers was in prior to (m) to a station of the first chamber that another of the N wafers was in prior to (m), (n) cause each of the N wafers to be placed on the pedestal of the station that that wafer was moved to in (m), (o) cause, in between (l) and (n), the destination wafer support for each of the wafers to rotate the corresponding wafer about the second axis of that destination wafer support relative to the indexer arm supporting that destination wafer support, and (p) cause the first chamber to perform one or more processing operations on the N wafers after (n).

In some implementations of the apparatus, the one or more memory devices may store additional computer-executable instructions for further controlling the one or more processors to repeat (l) through (p) one or more times.

In some implementations of the apparatus, the one or more memory devices may store additional computer-executable instructions for further controlling the one or more processors to repeat (l) through (p) N or more times.

In some implementations of the apparatus, the one or more memory devices may store additional computer-executable instructions for controlling the one or more processors to: f) select one of the N wafer supports as a destination calibration wafer support of the first chamber for a first calibration wafer; g) obtain information from the active wafer centering system indicative of a horizontal location of the center of the first calibration wafer; h) cause the robot arm to provide the first calibration wafer to the transfer pedestal of the first chamber; i) cause the indexer to rotate such that the destination calibration wafer support is positioned beneath the first calibration wafer; j) cause the first calibration wafer to be placed on the destination calibration wafer support; k) cause the destination calibration wafer support and the first calibration wafer supported thereby to rotate about the corresponding second axis by a first angular amount and in a first direction; l) cause the robot arm to retrieve the first calibration wafer from the first chamber; m) obtain information from the active wafer centering system indicative of an updated horizontal location of the center of the first calibration wafer; n) determine the wafer support offset for the destination calibration wafer support based, at least in part, on the horizontal location of the center of the first calibration wafer, the updated horizontal location of the center of the first calibration wafer, the first angular amount, and the first direction; and o) store, in a data structure, the wafer support offset for the destination calibration wafer support in association with the wafer support that is the destination calibration wafer support.

In some implementations of the apparatus, the one or more memory devices may store additional computer-executable instructions for controlling the one or more processors to repeat (f) through (o) N−1 times using a different one of the wafer supports as the destination calibration wafer support for each repetition.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIGS. 3-1 through 3-5 depict side views of an example transfer pedestal, indexer arm, and wafer handling robot during various stages of transitory wafer transfer.

FIG. 4 depicts an example of wafer edge thickness following a calibration process.

FIG. 5 depicts a flow diagram of such a multi-station pedestal offset determination technique.

The Figures herein are generally not drawn to scale, although various aspects of the Figures, e.g., as discussed below, may be drawn to scale.

DETAILED DESCRIPTION

Figure 1:
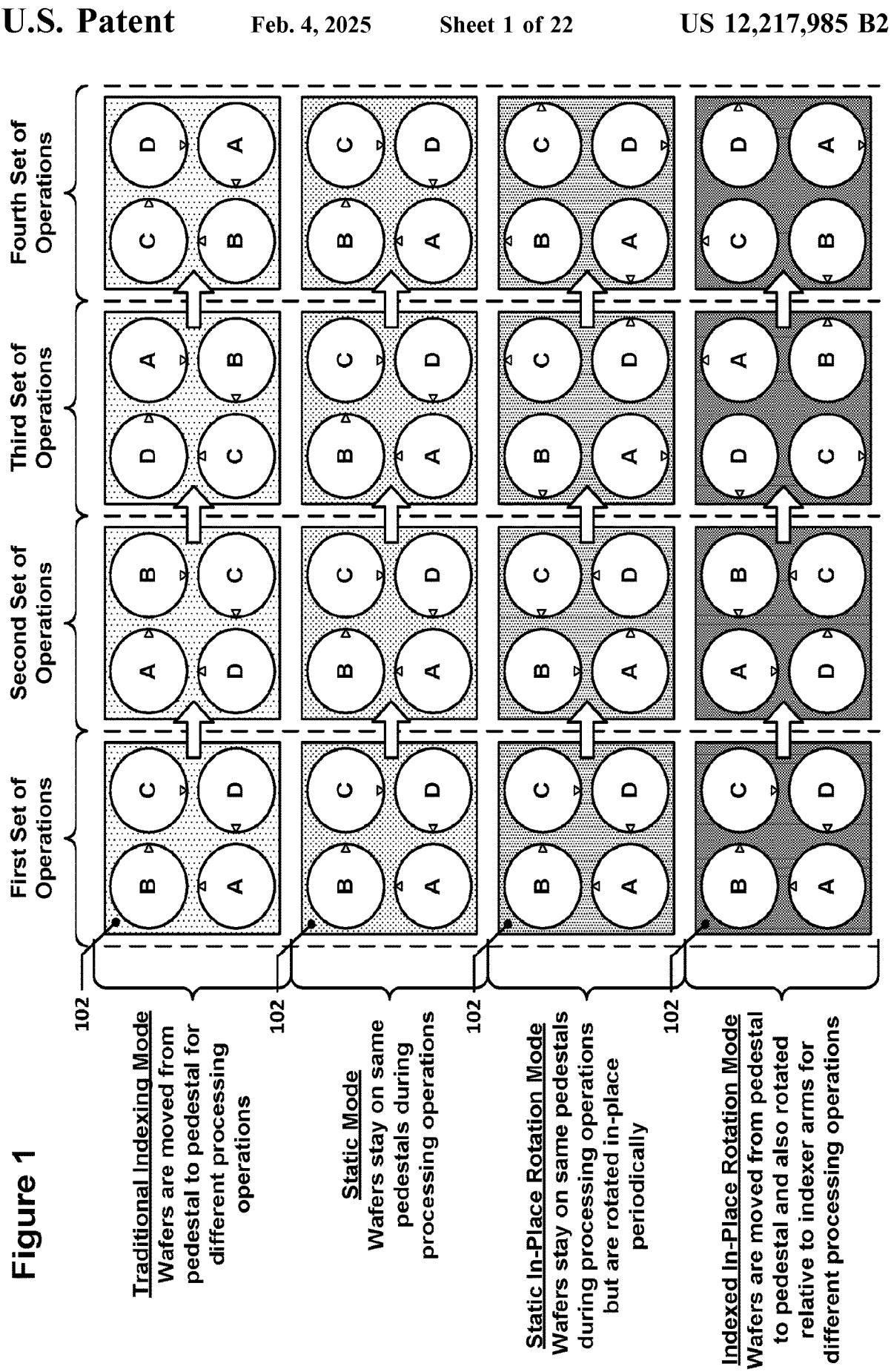
FIG. 1 depicts several different general types of single-chamber, multi-station processing techniques.

The wafer placement and wafer placement correction techniques and apparatuses discussed herein are broadly applicable to a variety of different single-chamber, multi-station processing techniques. FIG. 1 depicts several different general types of single-chamber, multi-station processing techniques.

In FIG. 1, a four-station semiconductor processing chamber 102 is shown during various sets of semiconductor processing operations according to various multi-station processing techniques. There are four different techniques shown in FIG. 1 (each technique represented by a different row), each having four sets of semiconductor processing operations (each set represented by a different column). In each technique, four wafers (A, B, C, and D) are initially loaded into the chamber 102 in the same positions and orientations (the orientation of each wafer is indicated by a small triangle located along the outer perimeter of the wafer). An indexer (not shown) may be used to position the wafers on their initial respective pedestals and (in some techniques) move the wafers from pedestal to pedestal in between sets of processing operations.

In the first technique, which represents typical multi-station chamber operations, the indexer for the chamber may simultaneously move the wafers from their respective stations to the next stations in the rotational sequence in between each set of semiconductor processing operations; this technique may be referred to herein as "traditional indexing mode." Thus, wafer A may be placed in the lower left corner pedestal/station for a first set of processing operations and then moved to the upper left corner pedestal/station for a second set of processing operations, then the upper right corner pedestal/station for a third set of processing operations, and then the lower right corner pedestal/station for a fourth set of processing operations. Wafers B, C, and D may be similarly moved from station to station, although each may start in/on a different initial station/pedestal. Since the indexer, in moving each wafer from station to adjacent station, also causes each wafer to rotate by 90°, the orientation of each wafer relative to the overall chamber will also rotate by 90° with each movement of the wafers from pedestal to adjacent pedestal. As a result, from the perspective of a radial coordinate system centered on the axis of rotation of the indexer, the orientation of each wafer as it is moved from station to station does not change. Thus, the same edge of each wafer may be closest to the center of the chamber (and the indexer rotational axis) regardless of which station/pedestal the wafer is placed in/on. If there are processing non-uniformities that manifest radially with respect to the chamber center, then this will result in the wafers developing a similar radial non-uniformity pattern that will be repeated at each station/pedestal, thereby exacerbating the non-uniformity. The traditional indexing approach may be used, for example, when each station in the multi-station chamber is configured to perform a different set of processing operations.

The second technique involves using the multi-station chamber as, in effect, four discrete processing chambers. Each wafer A, B, C, and D may be loaded onto a respective pedestal using the indexer, and may then remain on those respective pedestals for the durations of the first, second, third, and fourth sets of operations. The orientations or positions of each wafer do not change in between each set of processing operations; this mode of operation may be referred to herein as "static mode."

The third technique is similar to the second technique, but each wafer is rotated relative to the station/pedestal into/onto which the wafer is placed in between each set of processing operations; the wafers are not moved from station to station in between each set of processing operations, however. The third technique causes each wafer to be rotated, for example, by 90° relative to the overall chamber in between each set of processing operations, which may thereby cause any radial non-uniformities that may develop on the wafers to be averaged out after the wafers are processed using the first, second, third, and fourth sets of processing operations. This third technique may be referred to herein as "static in-place rotation mode."

In the fourth technique, each wafer is not only transferred from its respective pedestal to the next adjacent pedestal in between each set of processing operations, but is also additionally rotated (beyond the rotation provided by the movement of the wafers from station to station through the rotation of the indexer) in between each set of processing operations. For example, each wafer may be rotated 90° in moving from pedestal to pedestal through rotation of the indexer, and may be rotated a further 90° (either in the clockwise or counterclockwise direction) such that a different edge quadrant of each wafer is closest to the indexer axis of rotation for each set of semiconductor processing operations. This mode may be referred to herein as "indexed in-place rotation mode" herein.

It will be understood that the techniques discussed herein, and the examples provided above, focus on multi-station chambers having four stations/pedestals, but the techniques and apparatuses discussed herein may also be implemented in multi-station chambers having more or fewer stations/pedestals, including two-station, three-station, five-station, six-station, and greater than six-station chambers. Four-station chambers, however, are the most common type of rotationally indexed multi-station chamber since they offer the most economical use of floor space per wafer, and are thus the focus of the examples herein.

The static mode and the traditional indexing mode may both be practiced in mufti-station chambers having a traditional indexer, i.e., an indexer that is configured, in effect, to do nothing more than rotate the indexer arms in unison about the rotational axis of the indexer to move wafers from station to station. The static in-place rotation mode and the indexed in-place rotation mode, however, additionally require a mechanism for rotating each wafer about its own center axis without necessarily moving the wafer from station to station. Such a mechanism may be provided, for example, using an indexer having additional rotational axes, e.g., an indexer in which each wafer support may be caused to rotate about a corresponding rotational axis relative to the indexer arm that supports that wafer support, or, for example, using a pedestal that provides a mechanism for rotating the wafer placed thereupon in-place, e.g., a twist-pad or similar device. Thus, a multi-station chamber that is configured to perform either in-place rotation mode may generally also be able to be configured to perform static mode or traditional indexing mode as well by simply not using the mechanisms that allow the wafers to be rotated about their own center axes without necessarily moving the wafer from station to station. A particular semiconductor processing tool incorporating a multi-station chamber such discussed herein may be configured to perform all of the modes discussed above, depending on which mode is selected, or may only be configured to be able to perform a subset of such modes. For example, a semiconductor processing tool having a multi-station chamber with a "traditional" indexer, e.g., one that does not possess the ability to rotate wafers about their own axes relative to the indexer arms (and that otherwise does not have the ability to rotate wafers about their own centers without necessarily moving the wafers between stations), would not simply be able to be used to perform static in-place rotation mode or indexed in-place rotation mode.

Figure 2:
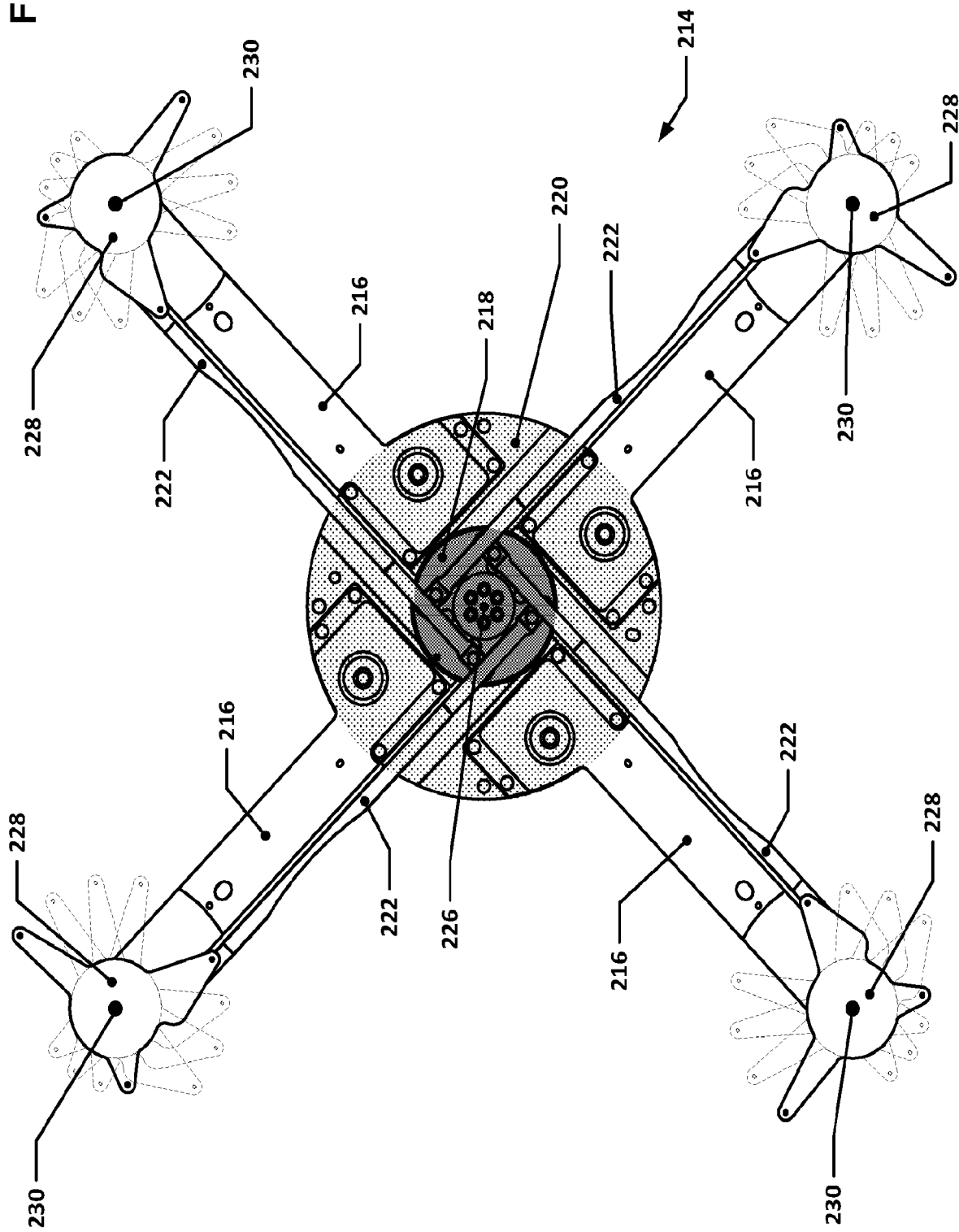
FIG. 2 depicts an indexer that features wafer supports that are configured to be rotatable relative to the indexer arms that support them.

The indexer having additional axes may, for example, be a new type of indexer recently developed by the assignee of the present disclosure that features wafer supports that are configured to be rotatable relative to the indexer arms that support them. FIG. 2 depicts an example of such an indexer. As can be seen, the indexer 214 has a plurality of indexer arms 216 that are circularly arranged around a center hub 220, with each indexer arm 216 having a wafer support 228 connected thereto with a bearing that allows the wafer support 228 to rotate relative to that indexer arm 216 about an axis of rotation 230 that is positioned to align with the center of a wafer supported by the wafer support 228 (assuming the wafer is perfectly placed on the wafer support 228).

In some such indexers, each wafer support 228 is connected by a tie rod 222 to a an actuator hub 218 that is configured to rotate about the axis of rotation 226 of the indexer; the actuator hub 218 is able to be rotated about the rotation axis 226 of the indexer 214 independently of the center hub 220 of the indexer 214 to which the indexer arms 216 are attached. The tie rods 222, rotatable wafer supports 228, actuator hub 218, and indexer arms 216 form sets of four-bar linkages that cause the rotatable wafer supports 228 to rotate in unison relative to their respective indexer arms 216 when the actuator hub 218 is rotated relative to the center hub 220. When both the actuator hub 218 and the center hub 220 are rotated in unison, however, the indexer 214 will behave like a traditional indexer, i.e., move wafers from station to station without further rotation beyond that provided by a traditional indexer. An indexer having additional rotational axes beyond the central rotational axis of the indexer, e.g., separate rotational axes for the wafer supports, is discussed in depth in U.S. Pat. No. 10,109,517, issued Oct. 23, 2018, which is hereby incorporated herein by reference in its entirety.

The wafer placement correction techniques discussed herein are particularly applicable in the context of static mode, static in-place rotation mode, and indexed in-place rotation mode.

Generally speaking, when a wafer is placed into a semiconductor processing chamber, it is typically desirable to place the wafer in a location that is centered on the pedestal receiving the wafer. Wafer handling robots, which are used to transfer wafers into the semiconductor processing chambers from locations outside of the semiconductor processing chambers, are typically "trained" after a semiconductor processing chamber has been installed as part of the chamber setup process. During training, a wafer handling robot may be equipped with a calibration fixture that may take the place of a wafer that the wafer handling robot is designed to support. The calibration fixture may, for example, be affixed to an end effector of the wafer handling robot that is normally used to transport wafers. The calibration fixture may be designed to interface with features on a transfer pedestal of the processing chamber (or with another fixture that may be affixed thereto) to allow the wafer handling robot to be manually (or automatically) moved to a particular position relative to the transfer pedestal; the terms "transfer pedestal" or "transfer station" are used herein to refer to a station or pedestal of processing chamber that are positioned so as to serve as the first station or pedestal that a wafer introduced into the processing chamber will encounter after being introduced into the processing chamber. It will be understood that a when reference is made herein to placing a wafer "on" a transfer pedestal, such placement may include wafer placement in which the wafer is resting directly on the pedestal top surface, e.g., as it would be during semiconductor processing operations, but may also include "transitory placement" in which the wafer may be supported in the air by the lift pins of the pedestal but never actually lowered onto the pedestal top surface, e.g., as may be the case when a wafer is placed on the transfer pedestal and then moved therefrom to another pedestal by the indexer almost immediately after such placement. It will be further understood that a transfer pedestal may also serve as the last station or pedestal that a wafer introduced into the processing chamber will be in prior to being removed from the processing chamber, e.g., by a wafer handling robot.

Figures 1, 3:
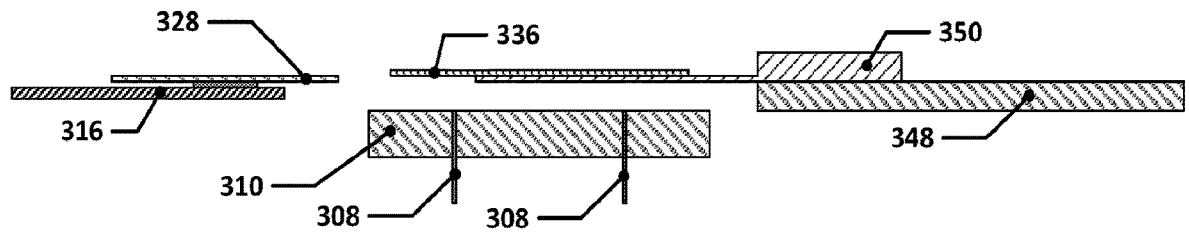
Figures 2, 3:
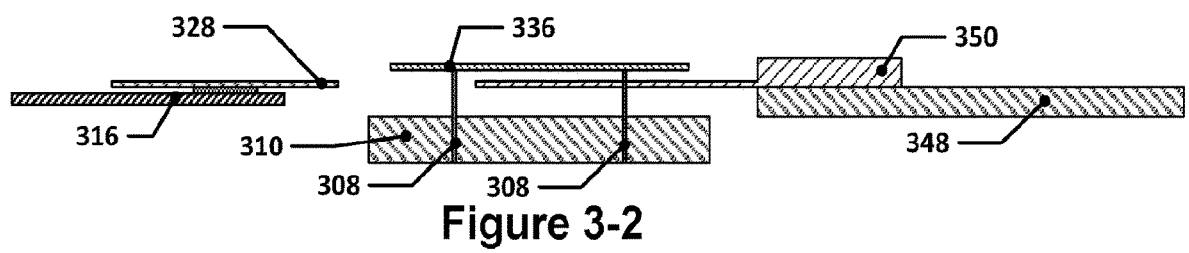
Figure 3:
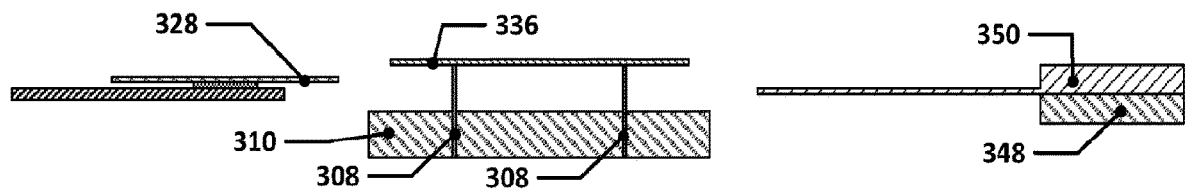

FIGS. 3-1 through 3-5 depict side views of an example transfer pedestal, indexer arm, and wafer handling robot during various stages of transitory wafer transfer. In FIG. 3-1, a wafer 336 is supported by an end effector 350 of a robot arm 348 of a wafer handling robot. The wafer 336 has been positioned above a transfer pedestal 310, and an indexer arm 316 with a wafer support 328 located at a distal end thereof is positioned nearby the transfer pedestal 310. The transfer pedestal 310 may have lift pins 308 which may be retracted to avoid potentially colliding with the end effector 350 and/or the wafer 336 as the robot arm 348 moves the end effector 350 and the wafer 336 into position above the transfer pedestal 310.

In FIG. 3-2, the lift pins 308 have been extended from the transfer pedestal 310 so as to lift the wafer 336 clear of the end effector 350, thereby causing the robot arm 348 to provide the wafer 336 to the transfer pedestal 310. In FIG. 3-3, the robot arm 348 has withdrawn the end effector 350 from underneath the wafer 336.

Figures 3, 4:
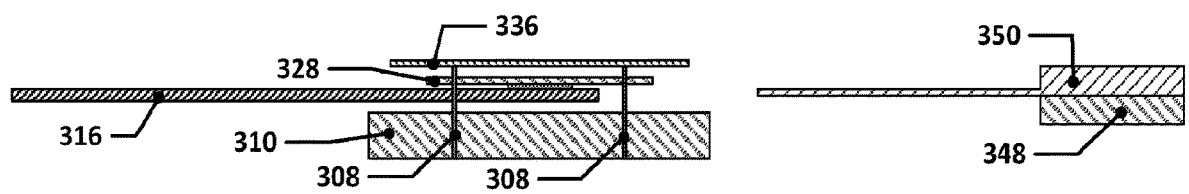

In FIG. 3-4, the indexer arm 316 may be rotated to cause the wafer support 328 to be positioned underneath the wafer 336. Finally, in FIG. 3-5, the lift pins 308 may be lowered and the wafer 336 placed upon the wafer support 328 of the indexer arm 316. It will be appreciated that in some implementations, the wafer 336 may also be lowered into direct contact with the upper surface of the transfer pedestal 310 that is stationary with respect to the lift pins 308 prior to being transferred to the wafer support 328. Either scenario is considered herein to provide a wafer to the transfer pedestal.

In most multi-station chambers, only one or two of the stations/pedestals of the chamber are transfer pedestals, with the remaining pedestals only being able to have wafers placed upon them through the operation of the indexer, i.e., by being placed in the transfer station of the chamber and then moved to the ultimate destination pedestal through operation of the indexer.

During training, the calibration fixture may be mechanically fixed in place through contact between features of the calibration fixture and the transfer pedestal (or another fixture mounted thereto). Once the wafer handling robot has been placed in a position relative to the pedestal that is considered desirable, e.g., a position that the wafer handling robot would be in when placing a wafer that was centered on the pedestal, the wafer handling robot may be "taught" that position, e.g., the wafer handling robot may be caused to store the coordinates of that position (or, for example, the various angular positions of each link in the robot arm) in association with a particular position, e.g., "pedestal center." This serves to allow the wafer handling robot to learn where the pedestal is positioned relative to the coordinate system that the wafer handling robot operates within, thereby allowing the wafer handling robot to accurately place wafers relative to the pedestal.

While the calibration fixture used to teach wafer handling robots may be fixed in place relative to an end effector of the wafer handling robot and may thus be consistently placed relative to the end effector of the wafer handling robot, actual wafers that are placed on the wafer handling robot end effector do not benefit from the mechanical fixturing used to keep the calibration fixture in place and precisely located relative to the end effector. In practice, such wafers may be placed on the wafer handling robot with some variation relative to the end effector. Thus, if a wafer is not centered on the location of the end effector that is centered over the pedestal center in the "taught" position, then the wafer will similarly not be centered on the pedestal center when the wafer handling robot is directed to return to the taught position.

To account for such variation in placement of the wafer relative to the end effector, semiconductor processing chambers are often equipped with active wafer centering (AWC) systems. Such systems are typically located external to the chamber since the environment within the chamber during processing operations may destroy such sensors or otherwise interfere with their operation. In most systems, the AWC is mounted above and/or below a load port for a chamber so that wafers that are placed into the chamber by a wafer handling robot interact with the AWC system as they enter or leave the chamber. A typical AWC system utilizes multiple optical beam sensors that are each configured with an optical emitter to direct an optical beam in the vertical direction and an optical sensor that is positioned so as to detect the optical beam. When one of the optical beams is broken by an object, e.g., by a wafer, transiting the optical beam, the optical sensor detects the beam break. An AWC system, in conjunction with the robot arm positional awareness provided by sensors of the wafer handling robot, allows for determinations to be made as to where the center of a wafer is located relative to a particular frame of reference.

For example, after a wafer handling robot has been trained, it may be caused to retract the wafer from the chamber and through the AWC system (which is assumed in this example to be an AWC with two optical beam sensors, although other types of AWC systems can be used as well) along a particular path; as the wafer transits through the AWC system, four optical beam events will occur—for each of the two optical sensors, an optical beam event will occur when the edge of the wafer first interrupts the optical beam of the optical sensor, and another optical event will occur when the edge of the wafer stops interrupting the optical beam. The horizontal (XY) position of a reference point associated with the end effector, e.g., a reference point aligned with where the center of a wafer that is ideally placed on the end effector would be located (although any reference point that remains fixed in space with respect to the end effector may be used), of the wafer handling robot may be obtained for each such optical beam event, thereby providing a set of XY coordinates that may, in conjunction with the diameter of the wafer and the spacing between the optical beam sensors, be used to determine a wafer center location that is associated with the particular path followed by the wafer handling robot when transiting the wafer through the AWC system. When such wafer center determination is performed using, for example, the calibration fixture (which may be shaped like a wafer and have the same diameter of a wafer), this provides the wafer handling robot with two coordinates that may be used by the wafer handling robot to ensure that future wafers are placed correctly, e.g., centered, on the pedestal during placement operations. In short, the wafer handling robot knows, via position sensors, the location of the end effector associated with a centered placement of a wafer on the pedestal (having been taught this position with the calibration fixture, for example), the location of the end effector associated with the XY wafer center determined from passage of the calibration fixture through the AWC system, and the movements taken to move the wafer between both locations. Thus, if a wafer is placed on the end effector of the wafer handling robot in a position that is considered perfectly placed, i.e., with the wafer centered where it should be, then the AWC system should provide the same XY wafer center measurement for that wafer as it transits the AWC system along the particular path as was obtained for the calibration fixture. The wafer handling robot can then move to exactly the same XY location that it was taught for the pedestal placement operation to provide the wafer to the pedestal and the wafer will thereby be centered on the pedestal.

If a wafer is not perfectly placed on the end effector, however, the AWC system will provide a different XY wafer center measurement for that wafer compared to the XY wafer center associated with the calibration fixture as it transits the AWC system along the path used with the calibration fixture. If the wafer handling robot moves the wafer along the same path that was used with the calibration fixture, then the center of the wafer will be similarly displaced relative to the desired pedestal center when the wafer handling robot provides the wafer to the pedestal. To correct for such displacement, the wafer handling robot may be caused to adjust the target location for the reference point of the end effector relative to the pedestal from the calibrated location to a new location that is offset from the calibrated location by an offset vector that is identical to the offset vector between the two AWC-measured wafer center points, i.e., the calibrated wafer center point and the current wafer center point.

For example, if the calibration fixture has an overall disk shape and is pinned to the end effector such that the disk center is positioned where the wafer center is intended to be when the wafer is supported by the end effector, the reference point associated with the end effector may be selected to be the center of the calibration fixture. Thus, when the wafer handling robot is taught the XY location of the pedestal center, the reference point associated with the end effector would by centered on the pedestal center. Similarly, when the calibration fixture is passed through the AWC system, the measured center point of the calibration fixture and the reference point associated with the end effector would be collocated. If, subsequent to teaching the wafer handling robot, a wafer is placed on the end effector such that the horizontal position of the wafer center as determined by the AWC system when the wafer handling robot translates the wafer along the particular path has an (X, Y) offset of (1 mm, 2 mm) from the horizontal position of the center of the calibration fixture as measured by the AWC, then the wafer handling robot may be controlled so as to adjust the target destination of the reference point associated with the end effector by a correction offset of (−1 mm, −2 mm), which causes the reference point to no longer line up with the pedestal center but also causes the wafer center to be centered on the pedestal center for that placement operation. The correction offset that arises from, and corrects, initial misplacement of a wafer onto an end effector is referred to herein as an "end effector offset."

In some multi-station semiconductor processing chambers, the chamber may be placed in a process condition, e.g., at an elevated temperature and/or at a reduced pressure, which may cause the chamber, and the equipment contained therein, to undergo small displacements as compared with a non-process condition. For example, during teaching of a wafer handling robot, a processing chamber may typically be kept at room temperature and atmospheric pressure (which would generally be considered non-process conditions) since technicians must usually have access to the interior of the chamber during the teaching process to ensure calibration fixture alignment. During actual semiconductor processing operations, however, the chamber may reach temperatures of several hundred degrees Celsius, which may cause potentially significant thermal expansion displacements in the chamber. Similarly, when a chamber is placed under a vacuum, the pressure imbalance between the atmospheric pressure outside of the chamber and the vacuum environment within the chamber may cause the chamber walls to deflect, which may cause displacement of portions of the chamber and the equipment supported thereby. Thus, for example, the pedestal locations may shift, the indexer arms may increase in length, and so forth. As a result, a pedestal center location that was taught to a wafer handling robot with the chamber in a non-process condition will likely no longer be valid when the chamber is in a process condition, and wafers placed at that center point when the chamber is in a process condition may no longer be centered on the pedestal.

In order to adjust for such displacements, one or more calibration processes may be performed under the process condition in order to determine one or more correction offsets that may be used in addition to the end effector offset to ensure that wafers are placed in locations centered on the pedestal. To perform the calibration process, a calibration wafer (which may be a normal wafer that has been designated for use in the calibration process) may be provided to a transfer pedestal of a multi-station chamber by a wafer handling robot when the chamber is in the desired process condition; the horizontal location of the center of the calibration wafer may be determined by the AWC system as the calibration wafer transits through the AWC system during such provisioning. The wafer handling robot may, for example, apply an end effector offset, if desired, to cause any misalignment between the calibration wafer and the end effector to be canceled out. However, it will be understood that application of the end effector offset during the loading of the calibration wafer is optional, for reasons that will become evident from the discussion below.

Once the calibration wafer has been provided to the transfer pedestal, one or more calibration processing operations may be performed thereupon. Such operations may, for example, include deposition or etch operations that are intended to deposit or remove a layer of material with a circumferentially uniform thickness across the surface of the calibration wafer. While there may be some radial variation in thickness of the layer, the circumferential thickness of the wafer, i.e., the thickness of the calibration wafer along any circular path centered on the center of the calibration wafer, after the calibration process has completed should theoretically be constant or close to constant, e.g., with less than 0.1% variation. If the calibration wafer is not centered on the pedestal, however, there will be increased circumferential variation in the wafer thickness at the conclusion of the calibration process.

FIG. 4 depicts an example of wafer edge thickness following a calibration process; the plot shows circumferential thickness at a radius of ~147 mm for a 300 mm diameter calibration wafer as a function of angular position about the circumference of the calibration wafer. Two plots are shown—one with "x" data points (401), which represents a first calibration process performed with a first calibration wafer, and one with "+" data points (403), which represents a second calibration process performed with a second calibration wafer. As can be seen, the circumferential thickness of the first calibration wafer varies in a generally sinusoidal manner, with a maximum thickness (indicated by a diamond marker) occurring at about the 45° position and the minimum thickness (indicated by a circular marker) occurring at about the 225° position. The maximum and minimum wafer thicknesses about the circumference of the first calibration wafer may define a vector, indicated by the double-arrow line 405 in the representation of the first calibration wafer 436 shown in the lower half of FIG. 4 that passes through the center of the pedestal 406; the shading that is provided in the representation of the first calibration wafer represents zones of equal wafer thickness which are centered on the pedestal center. This vector establishes the angular direction of the offset between the center of the first calibration wafer and the pedestal center; the magnitude of the difference between the maximum and minimum thickness may generally be proportionate to the magnitude of the offset center of the first calibration wafer and the pedestal center.

Following the performance of the calibration process on the first calibration wafer and subsequent measurement of edge thickness (which may, for example, be performed on a metrology instrument located external to the chamber), a determination may be made as to a corrective offset that may be applied by the wafer handling robot for future wafers that may be delivered to the transfer pedestal thereby in order to cause such wafers to be centered on the pedestal center. The corrective offset, is referred to herein as a "pedestal offset," may be determined based, at least in part, on the offset between the pedestal center and the first calibration wafer center and the measured horizontal location of the center of the first calibration wafer using the AWC system. Thus, when a wafer is placed on the wafer handling robot end effector and passed through the AWC system for normal loading operations when the chamber is in the process condition, the wafer handling robot may cause the end effector to move to a position based on the "taught" position but taking into account the end effector offset (to account for variability in wafer placement relative to the end effector) and the pedestal offset (to account for variability in the location of the pedestal relative to the AWC system at the process condition as opposed to the location of the pedestal relative to the AWC system under the non-process condition under which the wafer handling robot was taught).

In some instances, the pedestal offset may first be tested on a second calibration wafer and then, if necessary, refined further. For example, a second calibration wafer may be placed on the end effector of the wafer handling robot and provided to the transfer pedestal (obtaining a horizontal wafer center location for the second calibration wafer using the AWC system in the process) using the end effector offset for the second calibration wafer and the pedestal offset such that the wafer center is positioned at the estimated center location derived from the first calibration wafer data. The same or a similar calibration process may then be performed on the second calibration wafer, which may then be removed from the chamber and evaluated using the same metrology tool mentioned above to obtain circumferential thickness data, e.g., the second data plot ("+" marks) in FIG. 4. As can be seen, the pedestal offset that was derived from the first calibration wafer thickness caused the wafer uniformity to improve, but the circumferential uniformity of the second calibration wafer can still be improved.

If the second calibration wafer results do not confirm that the pedestal offset based on the first calibration wafer results accurately centers the second calibration wafer on the pedestal, the pedestal offset may be refined based on the results of the first and second calibration wafer data. For example, the horizontal distance between the horizontal locations of the center points of the first and second calibration wafers as determined using the AWC system may be proportionate to the difference in non-uniformity between the first and second calibration wafers, allowing a more accurate pedestal offset to be determined and used to update the pedestal offset.

If the chamber will be operated at multiple different process conditions, the calibration process may be performed for each process condition for which it is desired to develop a pedestal offset.

Figures 3, 4, 5:
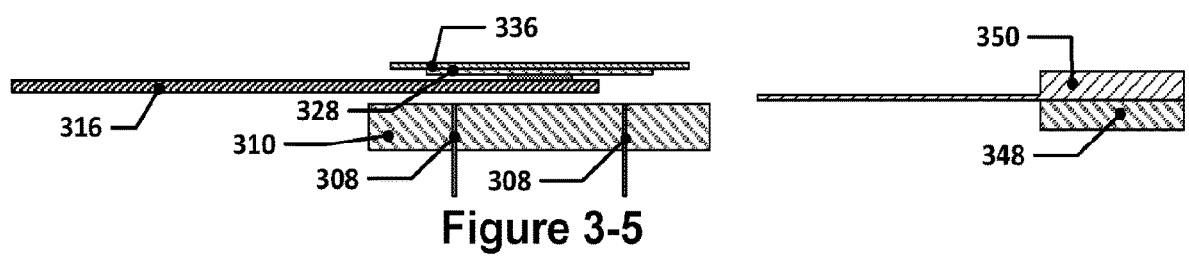
Figure 4:
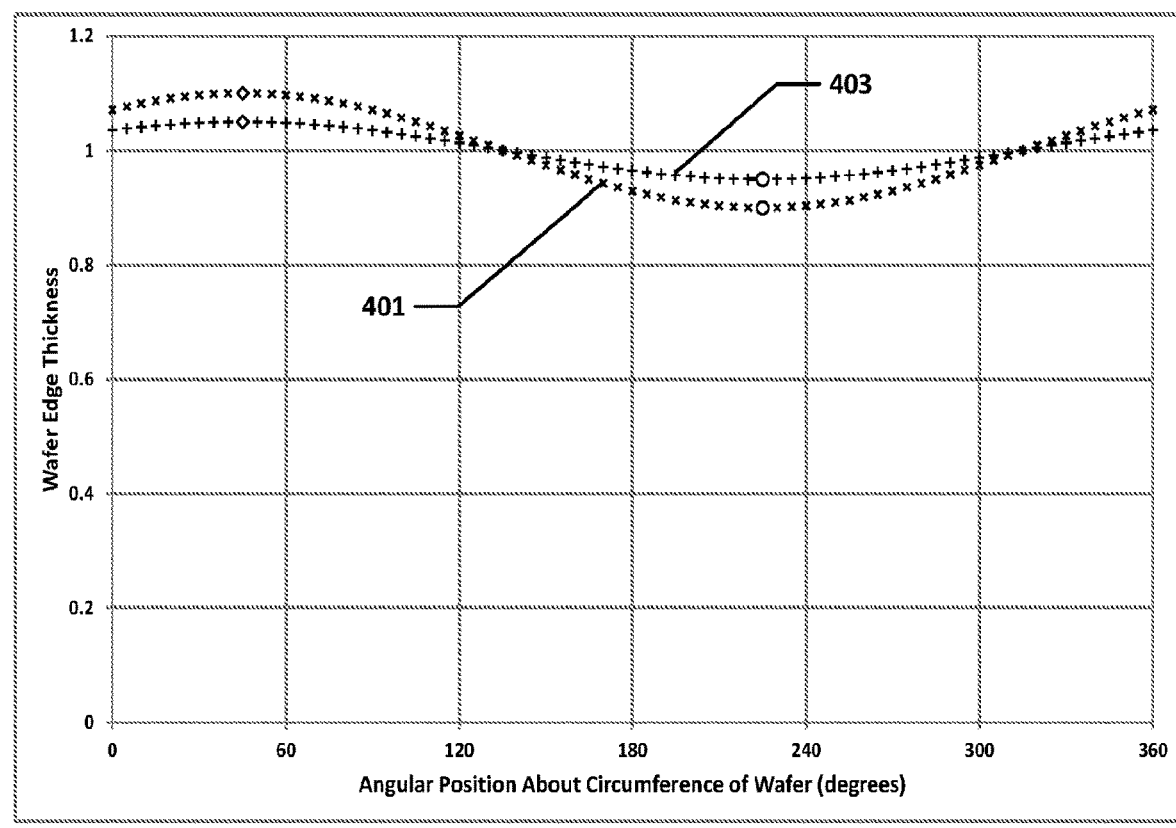
Figure 4:
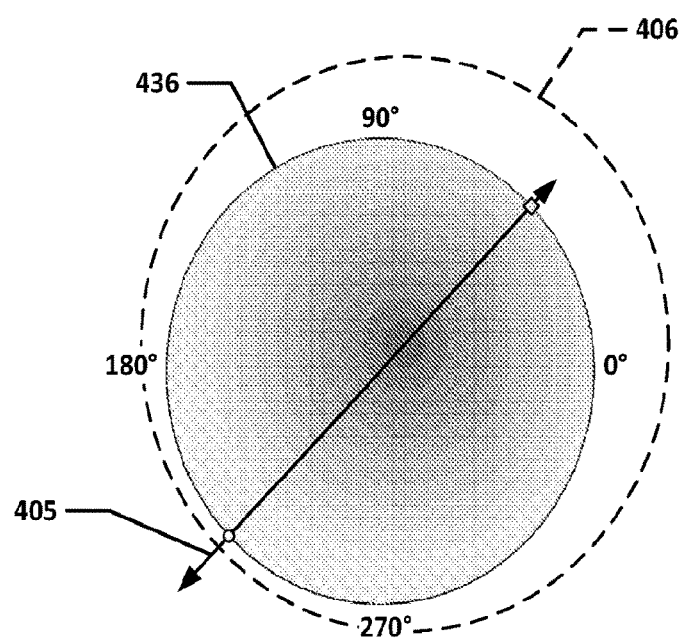
Figure 5:
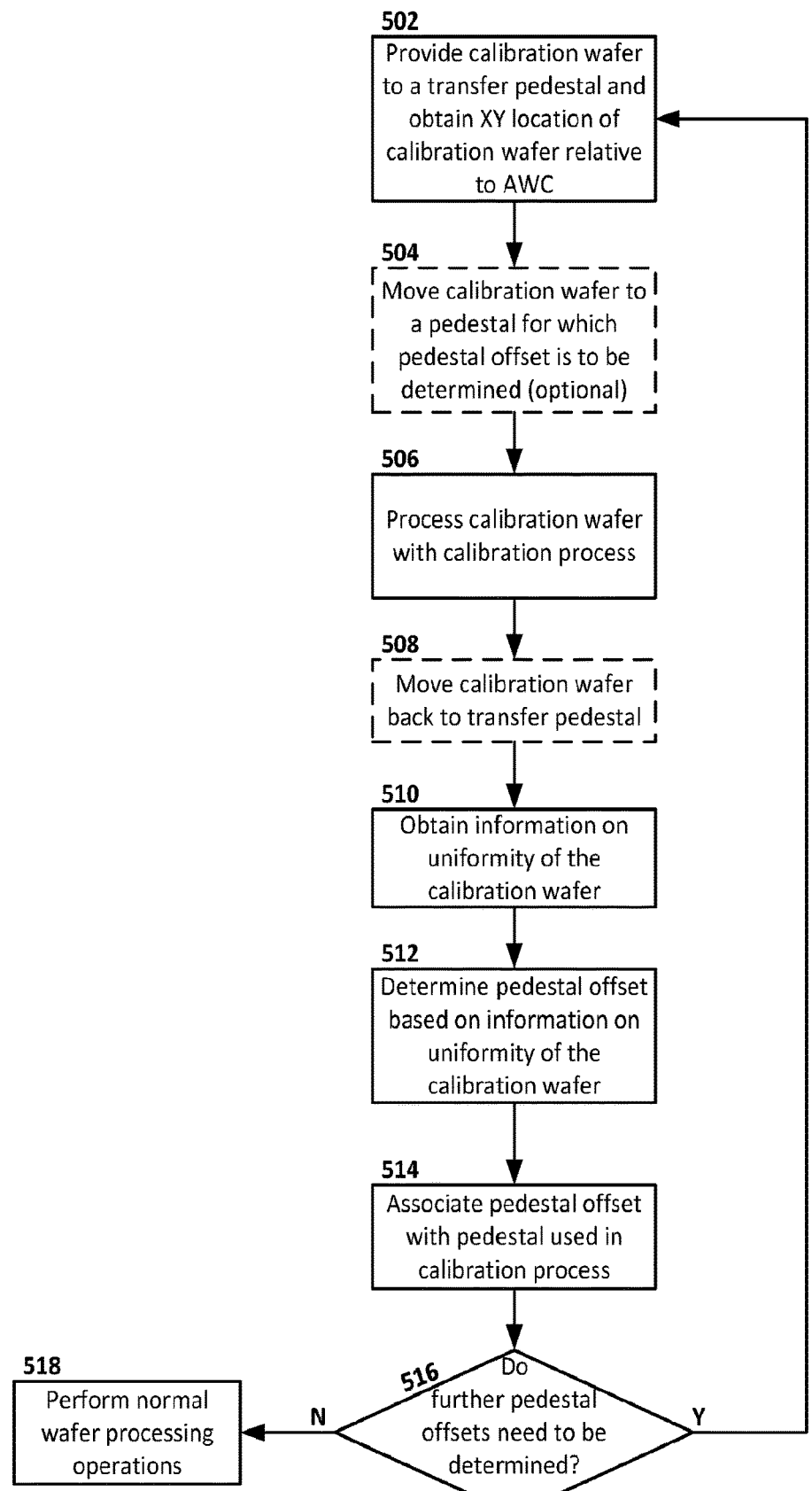

In the context of a multi-station chamber, pedestal offsets may be determined in largely the same manner as above for each separate pedestal in the chamber. FIG. 5 depicts a flow diagram of such a multi-station pedestal offset determination technique. In block 502, a calibration wafer may be provided to the transfer pedestal by a wafer handling robot; the center location of the calibration wafer relative to an AWC system may be determined by the AWC system during such provisioning. In block 504, the calibration wafer may be optionally moved off of the transfer pedestal by the indexer to the pedestal for which the pedestal offset is to be determined (this operation may be omitted if the pedestal for which the pedestal offset is being determined is the transfer pedestal itself). In block 506, the calibration process discussed above may be performed on the calibration wafer at whatever pedestal is supporting the calibration wafer (and for which the pedestal offset is being determined). In block 508, the calibration wafer may be optionally moved, by the indexer, back to the transfer pedestal from the pedestal on which the calibration process was performed (as with block 504, if the pedestal for which the pedestal offset is being determined is the transfer pedestal, then this operation may be omitted). In block 510, information may be obtained on the uniformity of the calibration wafer, e.g., using a metrology tool, and in block 512 the pedestal offset for the pedestal which supported the calibration wafer during the calibration process may be determined based on the information on the uniformity of the calibration wafer and the XY position of the calibration wafer as determined by the AWC system in block 502. In block 514, the pedestal offset may be stored in memory in association with information identifying the pedestal that supported the calibration wafer during the calibration process. In block 516, a determination may be made as to whether further pedestal offsets are to be obtained; if so, the technique may return to block 502, where the technique may be repeated to determine pedestal offsets for additional pedestals or performed again with the same pedestal to refine the pedestal offset already determined for that pedestal. If it is determined in block 516 that no further pedestal offset determinations need be made, the technique may proceed to block 518, where normal wafer loading may begin in order to start production-level wafer processing operations to begin.

Generally speaking, the indexer may be controlled to move in a consistent manner for wafer movement operations, including in both the process for determining the pedestal offsets and the later wafer placement operations that are part of normal processing. For example, in a four-station multi-station chamber, the indexer may be caused to rotate 90° for each wafer movement operation (to advance a wafer to the next pedestal/station). Ideally, the indexer rotational movement in moving a wafer from one station to the next may be 360°/N, where N is the number of stations/pedestals arranged about the indexer axis of rotation.

It will be understood that the techniques for determining end-effector offsets and pedestal offsets discussed above are simply example techniques, and that other techniques may be used as well. Regardless of how the end-effector offsets and/or the pedestal offsets are determined, the manner in which such end effector offsets and the pedestal offsets may be used to support static mode processing subsequent to such determination may generally be the same, as outlined per the discussion below with respect to FIG. 6.

Figure 6:
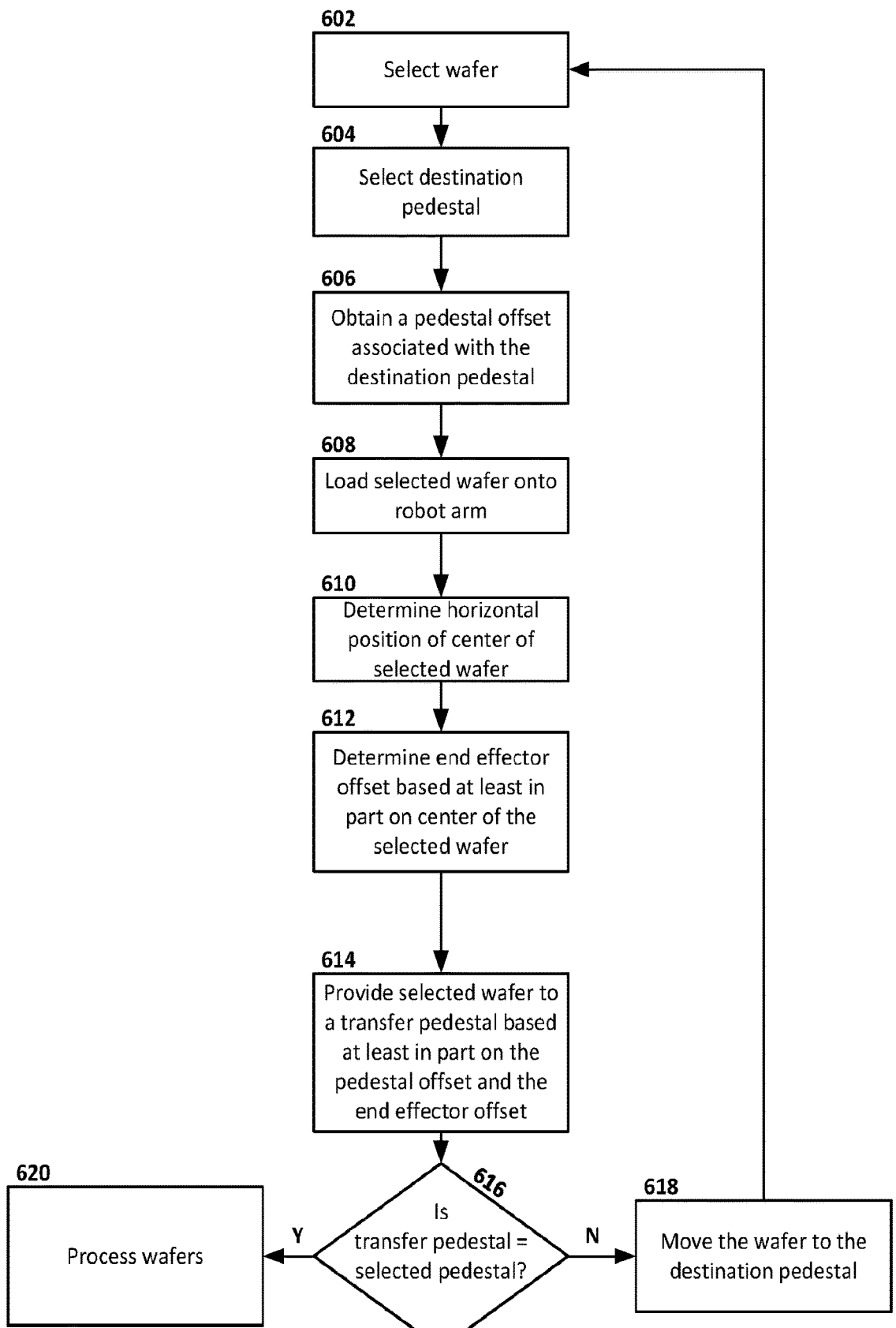
FIG. 6 depicts a flow diagram for a technique for placing wafers in a multi-station chamber in preparation for processing in static mode.

FIG. 6 depicts a flow diagram for a technique for placing wafers in a multi-station chamber in preparation for processing in static mode. The technique of FIG. 6 may begin in block 602, where a wafer may be selected for processing in a multi-station chamber. In block 604, a pedestal of the multi-station chamber may be selected as the destination pedestal for the selected wafer. The "destination pedestal" for a wafer, as the term is used herein, refers to the station/pedestal where that wafer will be positioned during semiconductor processing operations, usually in the context of static mode or static in-place rotation mode.

Once a destination pedestal for the wafer has been selected in block 604, a corresponding pedestal offset for that destination pedestal may be obtained in block 606. For example, a controller of the multi-station chamber may select the corresponding pedestal offset from a database that associates pedestal offsets with corresponding pedestals of the multi-station chamber.

Once the destination pedestal and the associated pedestal offset have been selected in block 606, the selected wafer may be loaded onto the end effector of a wafer handling robot in block 608 for placement on a transfer pedestal of the multi-station chamber. The selected wafer may also be placed on the end effector of the wafer handling robot prior to selection of the destination pedestal or the corresponding pedestal offset.

Once the selected wafer has been placed on the end effector of the wafer handling robot, the horizontal position of the center of the selected wafer relative to an AWC system of the multi-station chamber may be determined in block 610, as discussed earlier, and used to determine an end effector offset for the selected wafer in block 612.

In block 614, the selected wafer may be provided to the transfer pedestal of the multi-station chamber and positioned by the wafer handling robot based, at least in part, on the pedestal offset selected for the destination pedestal and the end effector offset determined for the selected wafer.

In block 616, a determination may be made if the transfer pedestal is also the destination pedestal; if not, then the technique may proceed to block 618, in which the indexer of the multi-station chamber may be caused to move the wafer from the transfer pedestal to the destination pedestal. In some implementations, the movement of the selected wafer to the destination pedestal from the transfer pedestal may occur in stages, with additional wafers being provided to the transfer pedestal in between each stage, each destined for a different one of the pedestals. The selected wafer may, in some such implementations, be continuously supported by the indexer or may, in other such implementations, be placed on another pedestal of the multi-station chamber and then picked up again by the indexer to continue the movement. After the selected wafer has been moved to its corresponding destination pedestal or, at the least, moved from the transfer pedestal, the technique may return to block 602, where the technique may be repeated for further selected wafers until the transfer pedestal is selected as the destination pedestal, at which point the technique may proceed to block 620, where the fully loaded mufti-station chamber may be used to process the loaded wafers.

The technique of FIG. 6 may also be used for partially loaded multi-station chambers, if desired, with loading of wafers to unused stations skipped. Additionally, in some implementations, a multi-station chamber may have two pedestals that serve as transfer pedestals. In such implementations, the multi-station chamber may have an AWC system that is specific to each transfer pedestal and there may be two pedestal offsets for each of the destination pedestals, each pedestal offset for a given destination pedestal having been determined for a different one of the two transfer pedestals. In such an implementation, the pedestal offset that is selected for the destination pedestal may be selected from a dataset that associates each pedestal offset with a different combination of pedestal and the transfer pedestal to be used to load the wafer into the multi-station chamber; when a wafer is to be placed on a selected transfer pedestal and destined to be moved to a selected destination pedestal, the pedestal offset that corresponds with the selected transfer pedestal and the selected destination pedestal may be used to place that wafer on the selected transfer pedestal.

The technique of FIG. 6 may be used to ensure that each wafer is ultimately placed on its destination pedestal in a location that is centered with respect to that destination pedestal, which may generally provide for the highest level of wafer uniformity during wafer processing static mode.

Figure 7:
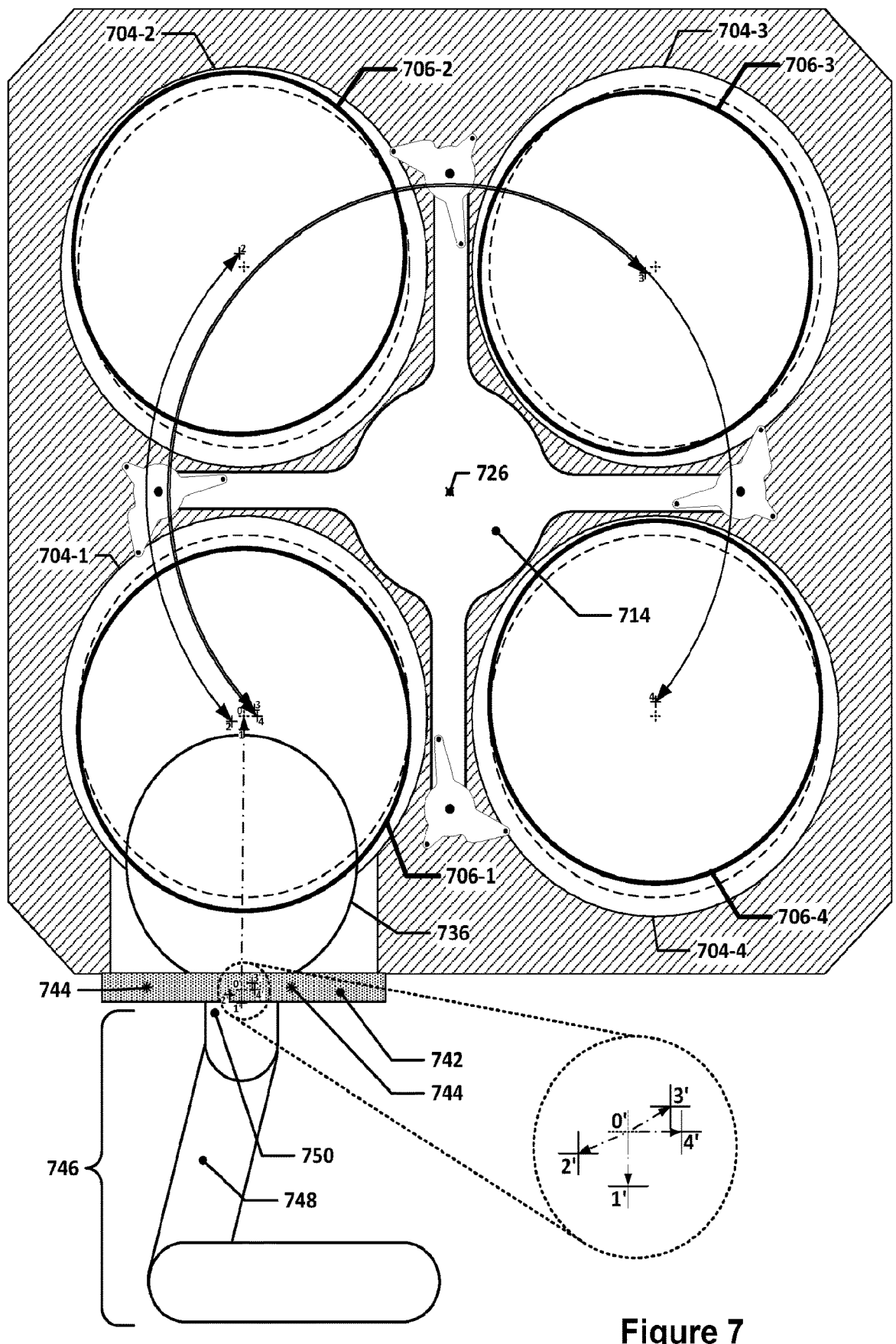
FIG. 7 depicts an example of a multi-station chamber with pedestals in an offset condition and the resulting pedestal offsets illustrated.

FIG. 7 depicts an example of a multi-station chamber with pedestals in an offset condition and the resulting pedestal offsets illustrated. In FIG. 7, multi-station chamber 702 includes four stations 704, each with a pedestal 706 (station 704-1, for example, has pedestal 706-1, and so forth). The dashed-line circles in each station 704 represent the location of each pedestal 706 within the corresponding station 704 when the multi-station chamber 702 is not in a process condition, e.g., when the multi-station chamber 702 is at room temperature and in equilibrium with atmospheric pressure conditions. In this particular example, each pedestal 706 is, when the multi-station chamber 702 is not in the process condition, centered within the corresponding station 704. The heavy solid-line outlines of the pedestals 706 represent the positions of the pedestals 706 when displaced, e.g., such as may occur when the chamber 702 is in a process condition. The dotted crosshairs in the middle of each dashed-line circle represent the center location of each pedestal 706 when the chamber 702 is not in the process condition. The solid-line crosshairs in the middle of each pedestal 706, which are indicated with the numbers 1, 2, 3, or 4 next to them to associate them with different stations 704/pedestals 706, indicate the centers of the displaced pedestals 706 when the chamber 702 is under the process condition.

In the case of station 704-1, there are solid-line crosshairs shown for each of the pedestals 706-2, 704-3, and 704-4, in addition to the solid-line crosshairs shown for the pedestal 706-1. The solid-line crosshairs for the pedestals 706-2, 704-3, and 704-4 in station 704-1 represent the center points of the pedestals 706-2, 704-3, and 704-4 when rotationally transformed about an indexer rotation axis 726 of the indexer 714 by 90° (from station 704-2), 180° (from station 704-3), or 270° (from station 704-4); the solid-line crosshairs for the pedestal 706-1 represent the center point of the pedestal 706-1 directly, without translation. The dotted-line crosshairs in station 704-1 with a "0" next to them represent the center of the pedestal 706-1 when in a non-displaced state, which may, in this example, correspond to the "taught" center of the pedestal 706-1 to which the wafer handling robot 746 would deliver wafers to such that the wafers are centered on the pedestal 706-1. The pedestal 706-1, in this example, is considered the transfer pedestal in accordance with the previous discussion regarding such a designation.

The chamber 702 is also equipped with an AWC system 742 which has, in this example, two optical sensors 744 that are configured to register when edges of a wafer, such as wafer 736 supported by an end effector 750 and robot arm 748 of a wafer handling robot 746, intersect with an optical beam emitted by either optical sensor 744 to allow for determinations to be made as to the center of the wafer 736 relative to the AWC system 742. The center points 1', 2', 3', and 4', as well as 0', represent the center points 1, 2, 3, and 4 shown in station 704-1 and the non-displaced center point of the pedestal 706-1 after having been displaced along a displacement vector that correlates with the displacement vector used by the wafer handling robot 746 when providing wafers to the transfer pedestal 706-1. As can be seen in the detail view provided in the lower right, each displaced pedestal center point, when rotationally transformed about the indexer rotational axis 726, may be located relative to the "taught" center point of the transfer pedestal such that a corresponding displacement vector is defined between the taught center point and each of the four "displaced" pedestal center points. These displacement vectors represent the pedestal offset need to ensure that a wafer that is centered on the 0' "taught" center point of the undisplaced transfer pedestal would be centered on a particular destination pedestal. For example, if the wafer 736 were to be provided to pedestal 706-2 and happened to be positioned such that its center point coincided with the 0' center point when evaluated by the AWC system 742, the wafer handling robot 746 would be caused to displace the end effector 750 such that the center of the wafer 736 was displaced from the 0' position by the displacement vector defined between the 0' and the 0 crosshairs (representing the displacement needed to align that wafer center with the center of the pedestal 706-1 when the pedestal 706-1 is in an undisplaced state and represented in FIG. 7 by a dash-dot-dash line) and the pedestal offset defined between the 0' center point and the 2' center point. The displacement vector and the pedestal offset may be applied separately, e.g., as two discrete movements, or a new displacement vector may be calculated that represents the total displacement represented by the original displacement vector combined with the pedestal offset. Similarly, if the wafer is not perfectly centered over the center point 0' when evaluated by the AWC system 742, then an additional end-effector offset may be similarly factored into the movements of the wafer handling robot 746 when placing the wafer.

While the above techniques are applicable to wafer placement in the context of multi-station chambers configured to perform static mode processing on wafers, different techniques may be practiced in the context of multi-station chambers configured to perform static in-place rotation mode processing and/or indexed in-place rotation mode processing using an indexer with additional rotational axes. In static in-place rotation mode processing and/or indexed in-place rotation mode processing using an indexer with additional rotational axes, instead of the pedestal offset, a wafer support offset may be used. In such in-place rotation modes, if the wafer is not centered on the rotational center of the wafer support used to perform the in-place wafer rotation, then the wafer may experience increasing misalignment with each successive wafer retrieval, rotation, and placement operation using that wafer support. To minimize or reduce such misalignment effects, the wafer may be assigned to a particular indexer arm and a wafer support offset associated with that particular indexer arm may then be used to adjust the positioning of the wafer relative to the transfer pedestal such that the wafer will be centered on the rotational axis of the wafer support located at the end of the selected indexer arm when retrieved from the transfer pedestal by the selected indexer arm. When so positioned, rotation of the wafer support relative to the indexer arm will result in little or, ideally, no movement of the center point of the wafer from its position prior to such rotation to its position after such rotation. In such implementations, the same indexer arm may be used to transport the wafer throughout the wafer's residence in the chamber, thereby ensuring that the center of the wafer remains aligned with the rotational axis of the wafer support associated with the wafer support offset.

Figure 8:
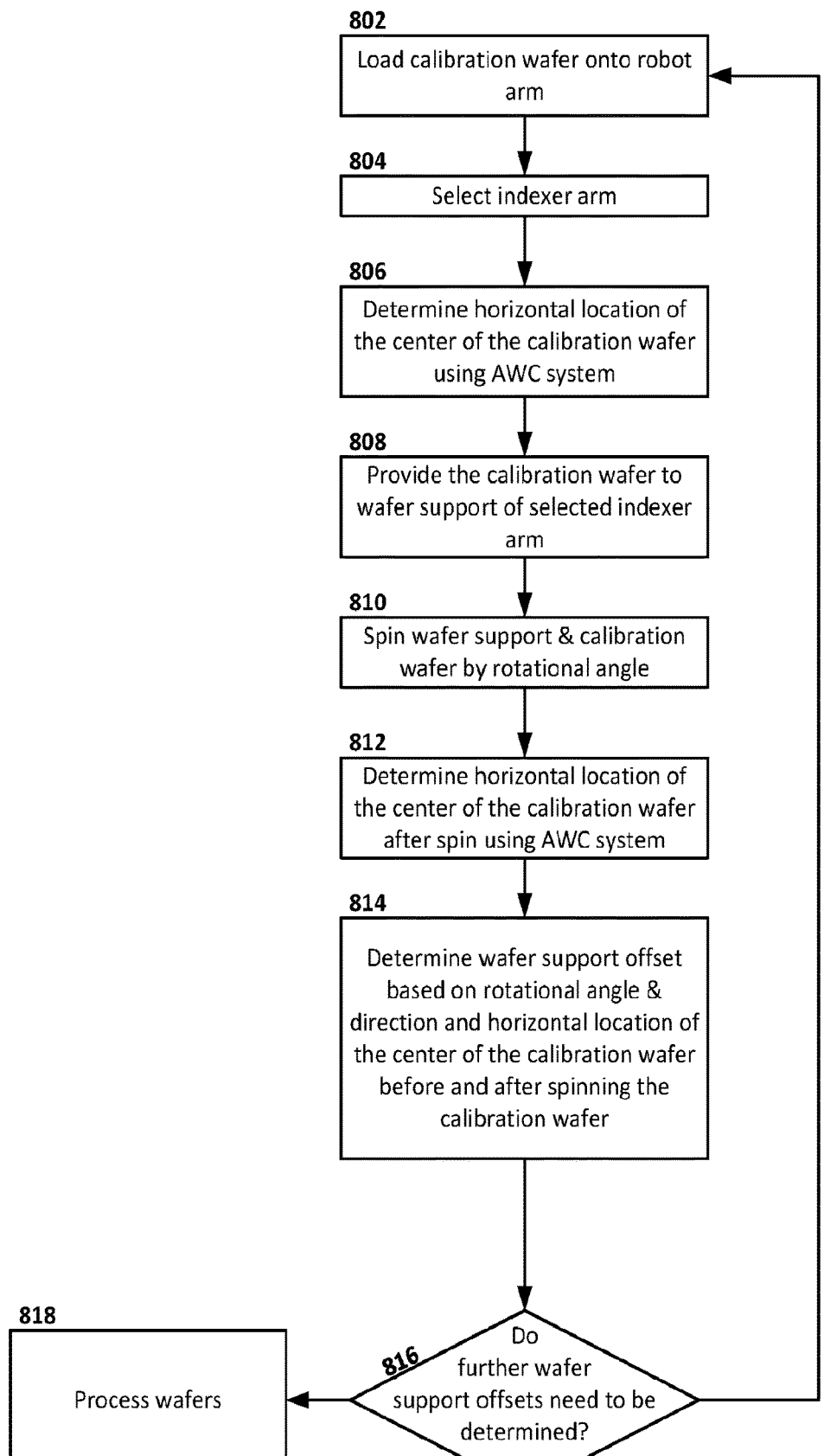
FIG. 8 depicts a flow diagram of a technique for determining wafer support offsets with a multi-station chamber in a particular process condition.

FIG. 8 depicts a flow diagram of a technique for determining wafer support offsets with a multi-station chamber in a particular process condition. The technique may begin in block 802, where a calibration wafer may be loaded onto the end effector of a wafer handling robot configured to place wafers in a multi-station chamber having an indexer with rotatable wafer supports that may be used to perform rotations of the wafers relative to the indexer arms. In block 804, the indexer arm of the indexer for which the wafer support offset is to be determined may be selected. In block 806, the calibration wafer may be passed through an AWC system of the multi-station chamber and a determination may be made as to the horizontal location of the center of the calibration wafer relative to the AWC system; the calibration wafer may then be provided to the wafer support of the selected indexer arm in block 808. For example, the wafer handling robot may cause the wafer to be provided to a transfer pedestal of the multi-station chamber, where lift pins of the transfer pedestal may extend and lift the calibration wafer off of the end effector of the wafer handling robot. The wafer handling robot may then withdraw the end effector from underneath the calibration wafer, after which the indexer may be rotated to cause the selected indexer arm to be positioned with the rotational axis of the wafer support of the selected indexer arm generally aligned with the center of the transfer pedestal when viewed along the vertical axis and with the wafer support of the selected indexer arm underneath the calibration wafer. The lift pins may then retract into the transfer pedestal and lower the calibration wafer onto the wafer support of the selected indexer arm.

Once the calibration wafer is loaded onto the wafer support, the wafer support may be caused, in block 810, to rotate or spin relative to the indexer arm to which the wafer support is attached by a predetermined angle. For example, the rotatable wafer support may be caused, for an indexer with four indexer arms, to rotate by 90° relative to the indexer arm to which it is mounted, although other angles of rotation may be used as well; the indexer arm itself may be kept from rotating while the wafer support for that indexer arm is rotated. After such rotation, the calibration wafer may be caused to be retrieved by the end effector of the wafer handling robot and passed through the AWC system again in block 812 to determine the horizontal location of the center of the calibration wafer relative to the AWC system after the calibration wafer has been rotated by the predetermined angle by the wafer support. The wafer handling robot, in providing and retrieving the calibration wafer to the transfer pedestal and passing the calibration wafer through the AWC system to obtain the horizontal location of the center of the calibration wafer, may be caused to follow the same motion path such that the only displacement between the calibration wafer center relative to the AWC system both before and after the rotation arises from misalignment between the wafer center and the axis of rotation of the wafer support.

After the angle of rotation of the wafer support and the horizontal location of the center of the calibration wafer relative to the AWC system both before and after the rotation of the calibration wafer are determined, the wafer support offset may be determined through the use of trigonometry and geometric relations to determine the horizontal distance between the calibration wafer center and the axis of rotation for the wafer support. For example, if the horizontal distance between the two calibration wafer center point measurements is x and the angle of rotation is θ, the horizontal distance between either of the two calibration wafer center points and the axis of rotation of the wafer support, which may be referred to herein as the "radial distance" or r, may be determined according to $r = x \cdot a \tan(\theta)$. Once the radial distance is known, two potential solutions for the location of the axis of rotation (shifted to the frame of reference of the AWC system in the reverse of the manner in which the wafer center was shifted from its pre-rotation horizontal location to its horizontal location on the wafer support) may be determined by solving for the intersections between two circles each having a radius equal to the radial distance r and each centered on a different one of the horizontal locations of the calibration wafer as determined by the AWC system. The correct location of the axis of rotation may be selected from these two possible solutions by considering the direction of rotation and the relative positioning of the two horizontal center locations. For example, if the direction of rotation of the wafer support was clockwise, then the correct axis of rotation solution may be determined, for example by rotating the horizontal center point of the calibration wafer prior to rotation of the calibration wafer about each of the two potential axis of rotation locations by the same angular amount as was applied to the wafer support and in the same rotational direction; the correct axis of rotation will be indicated by the rotated position of the horizontal location lining up with the horizontal position of the calibration wafer after the rotation of the calibration wafer is performed. The axis of rotation location that is determined in this manner is actually the location of the axis of rotation based on a displaced coordinate frame; but if a wafer is positioned with its center point collocated with the axis of rotation determined per the above and is then moved by the wafer handling robot in the same manner as was used during the calibration process, then the wafer center point will be aligned with the rotational center of the wafer support of the indexer arm.

Once the location of the axis of rotation of the wafer support relative to the AWC system has been established, the wafer support offset may be determined in block 814 based on the magnitude and direction of the vector between the "taught" location of the pedestal center (or some other reference frame) and the location of the axis of rotation of the wafer support relative to the AWC system.

In block 816, a determination may be made as to whether the determination of further wafer support offsets is needed; if so, the technique may return to block 802 for further determinations of such wafer support offsets for the wafer supports of other indexer arms. Once the wafer support offsets have been determined for each of the indexer arms, the technique may proceed to block 818, in which normal wafer processing operations may begin.

It will be understood that the technique of FIG. 8 may be performed with the multi-station chamber being in one or more process conditions—such wafer support offsets may be determined for each process condition generally anticipated to potentially be present when a wafer is to be introduced into to multi-station chamber. Additionally, if there are two potential wafer load points, e.g., two transfer pedestals, separate sets of wafer support offsets may be determined using two different AWC systems, one for the first transfer pedestal and the other for the second transfer pedestal.

For further understanding, FIGS. 9 through 12 depict a calibration wafer during various states of the above technique when the calibration wafer is placed in a way that centers it on the rotation axis of the wafer support. FIGS. 13 through 16 depict a calibration wafer during various states of the above technique when the calibration wafer is placed in a way that results in it not being centered on the rotation axis of the wafer support.

Figure 9:
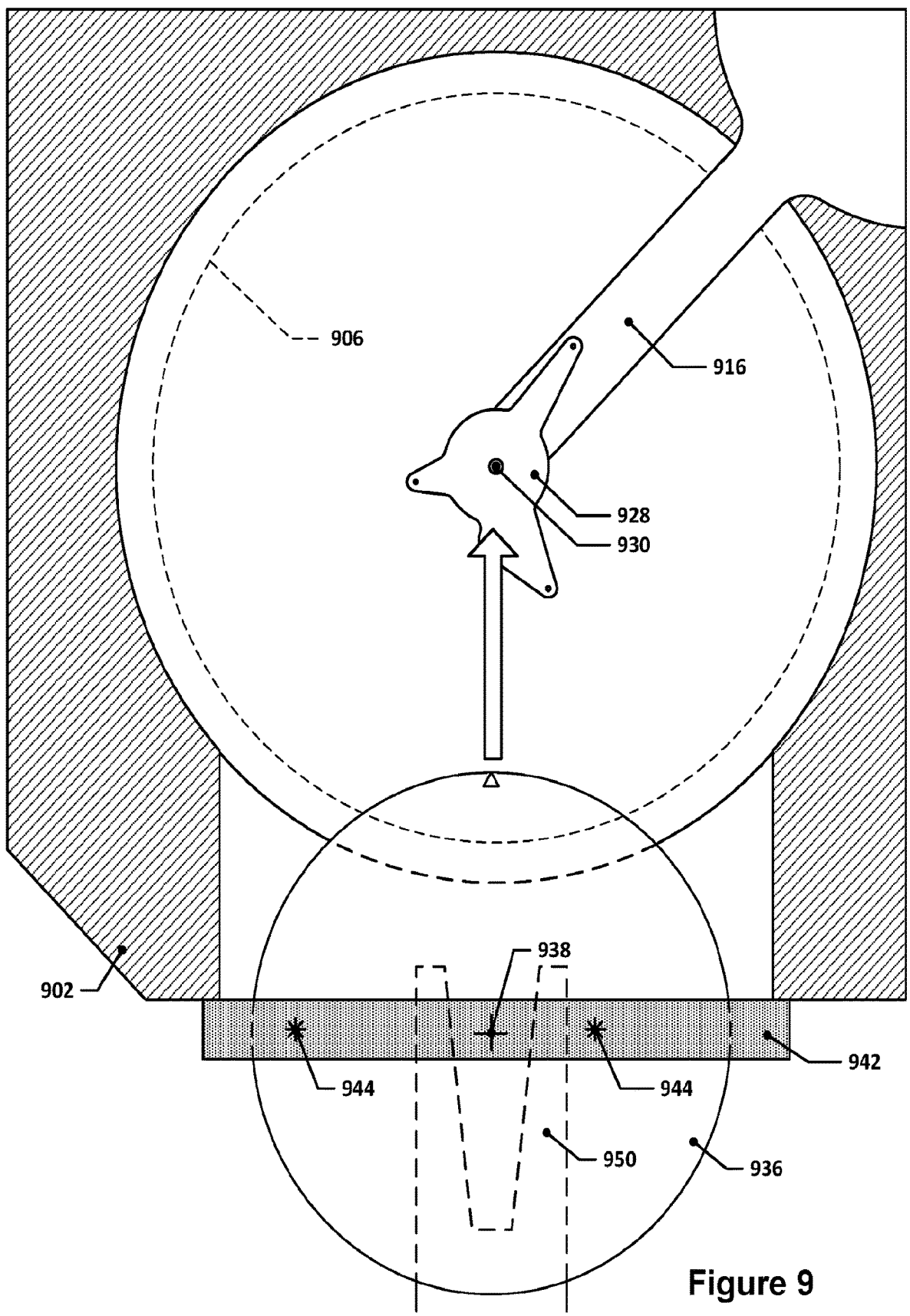
FIGS. 9 through 12 depict a calibration wafer during various states of the above technique when the calibration wafer is placed in a way that centers it on the rotation axis of the wafer support.
Figure 10:
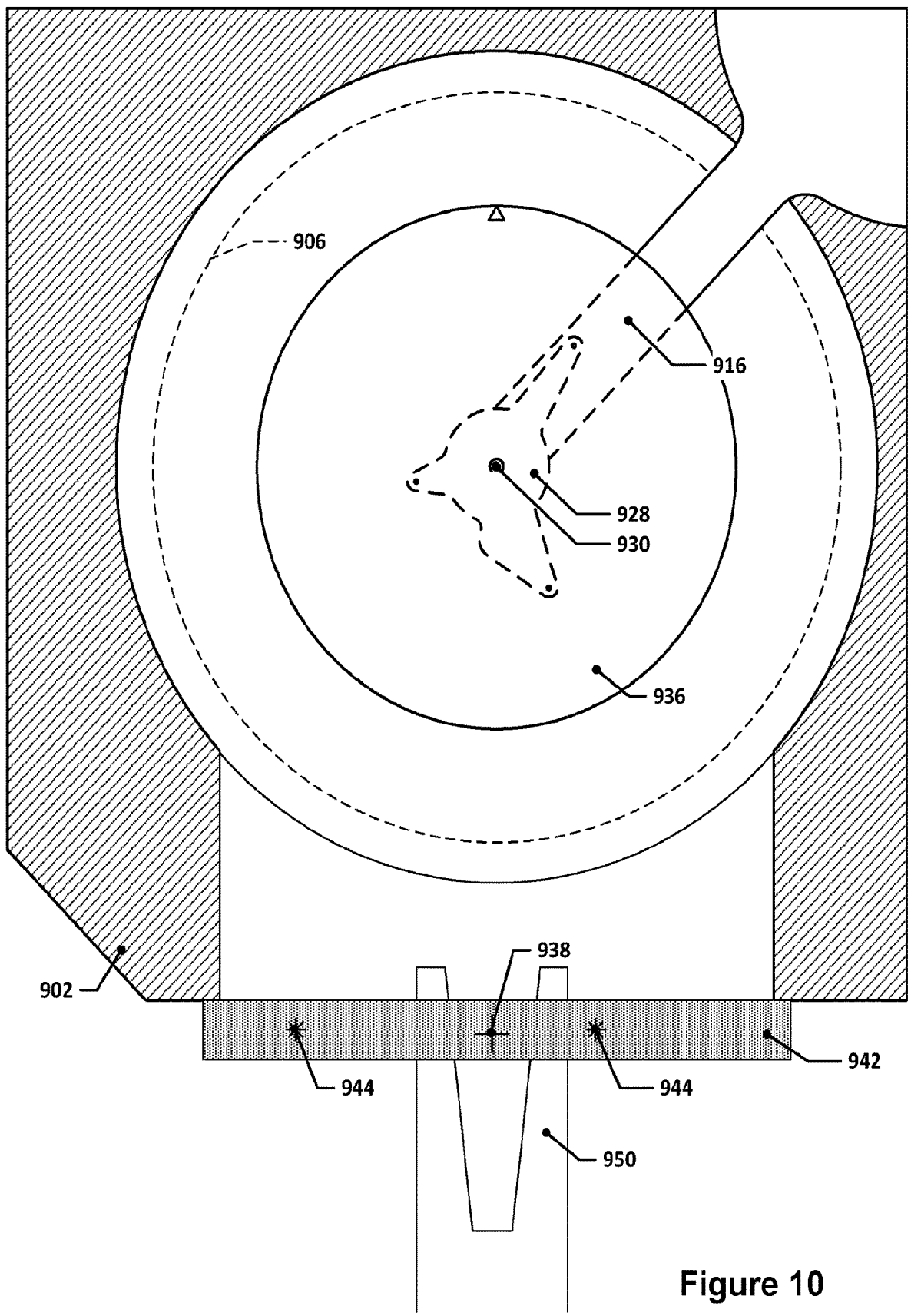

In FIG. 9, a wafer handling robot with an end effector 950 is caused to transport a wafer 936 through an AWC system 942 having optical sensors 944 which may be used to determine a horizontal location 938 of the center of the wafer 936 relative to the AWC system 942. The wafer handling robot may then provide the wafer to the wafer support 928, which may be attached to indexer arm 916 that is positioned over pedestal 906 of multi-station chamber 902, as shown in FIG. 10. The wafer 936 is provided to the wafer support 928 in a particular orientation, as indicated by the triangular indicator along the upper edge of the wafer 936.

Figure 11:
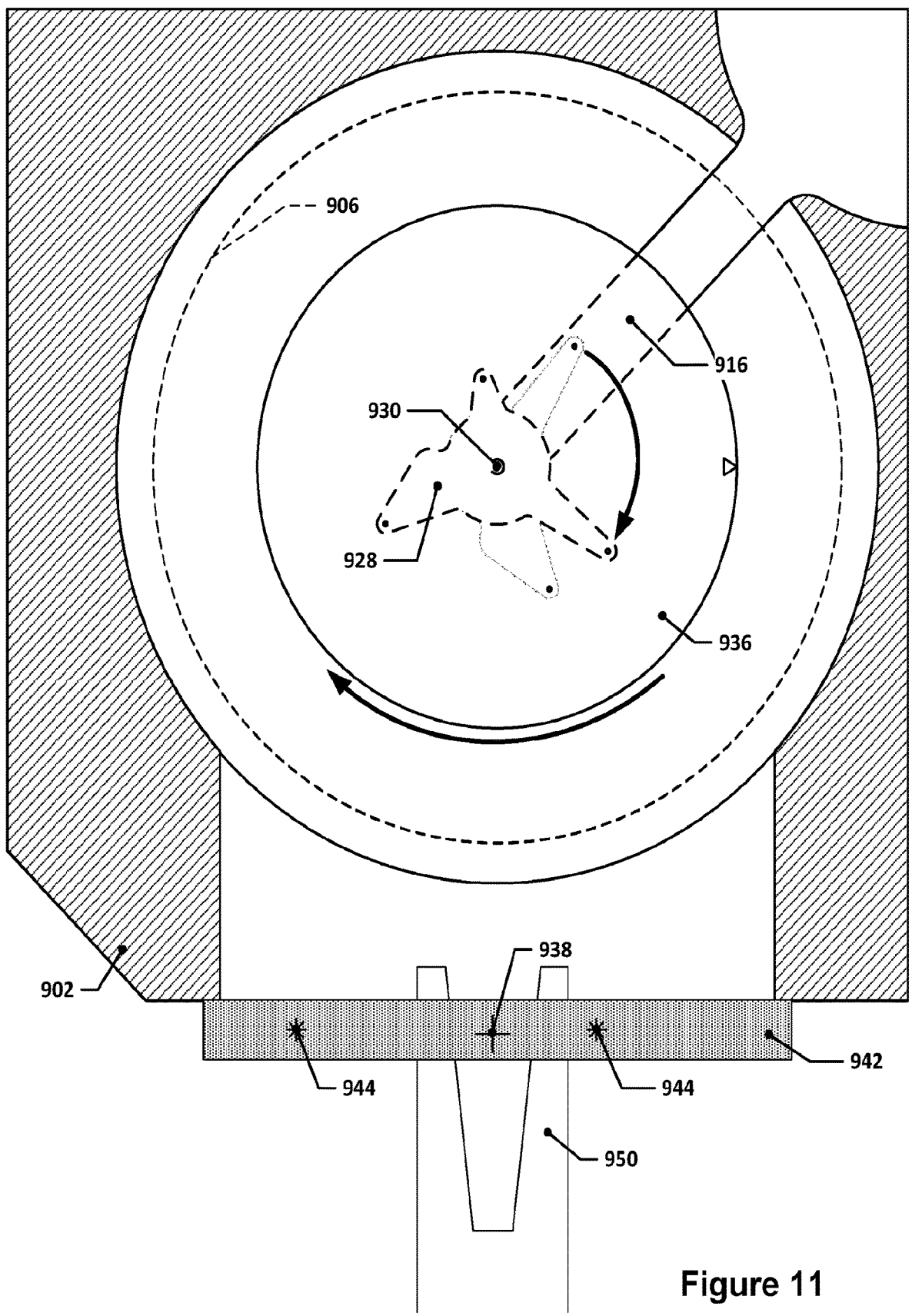
Figure 12:
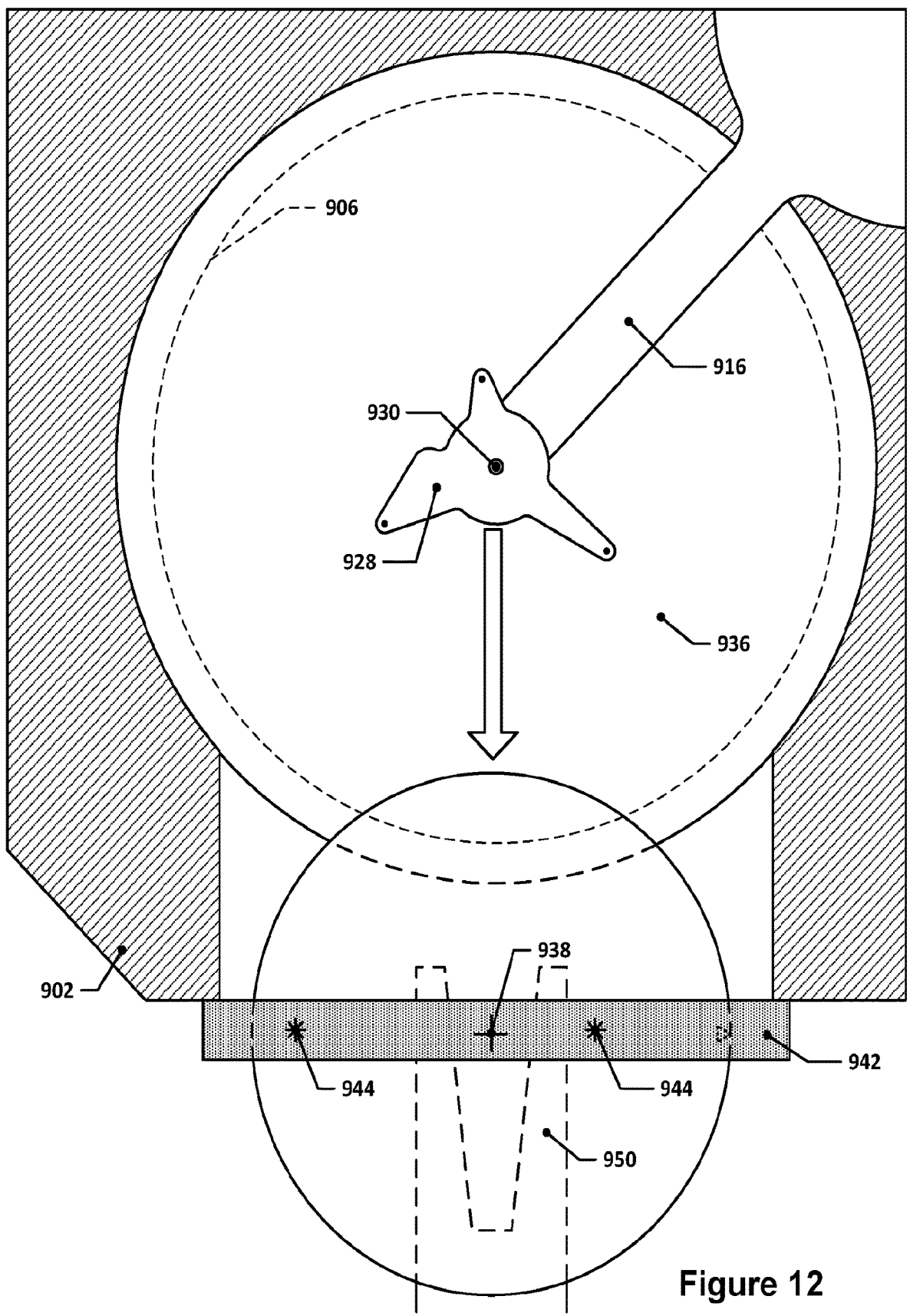

After the wafer 936 is provided to the wafer support 928, the wafer support 928 and the wafer 936 may be rotated about the axis of rotation 930 by a predetermined amount, as shown in FIG. 11. In this particular, case the angle of rotation is 90°, causing the triangular indicator shown to rotate to the 3 o'clock position from the 12 o'clock position (the location of the wafer support 928 is shown as a grey dotted outline).

After the wafer 936 and the wafer support 928 are rotated by the predetermined amount, the end effector 950 may be caused to retrieve the wafer 936 and pass the wafer 936 through the AWC system 942 again, thereby obtaining a second measurement of the center of the wafer 936 relative to the AWC system 942. In this case, there was perfect alignment between the center of the wafer 936 and the axis of rotation 930, and thus no displacement of the center of the wafer 936 occurred due to the rotation.

Figure 13:
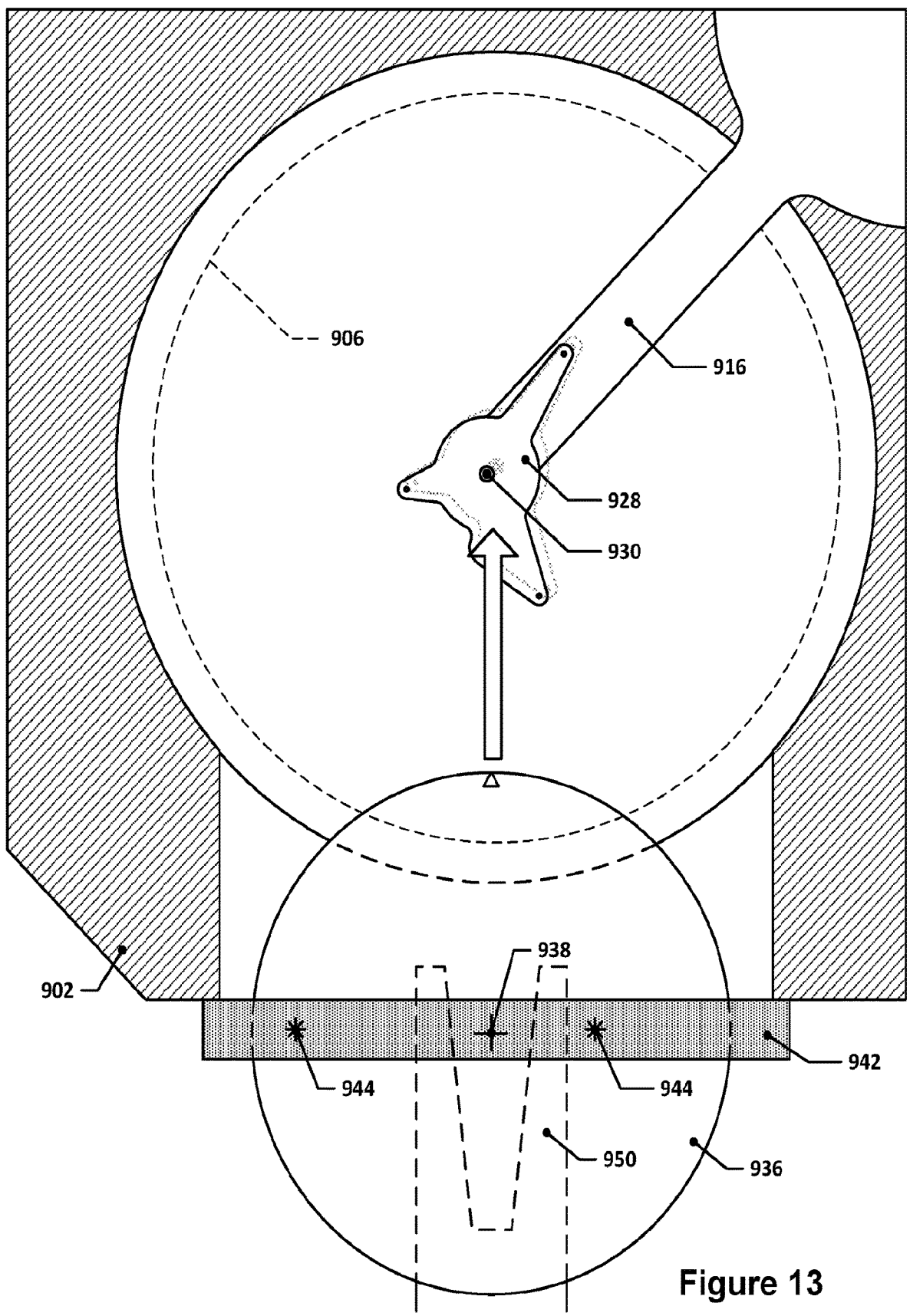
FIGS. 13 through 16 depict a calibration wafer during various states of the above technique when the calibration wafer is placed in a way that results in it not being centered on the rotation axis of the wafer support.

In FIG. 13, the wafer 938 is provided to the wafer support 928 in the same manner as in FIG. 9. However, the multi-station chamber 902 is under a process condition that has resulted in the wafer support 928 and the axis of rotation 930 thereof shifting from the location shown in FIG. 9, e.g., due to thermal expansion of the indexer arm 916, for example. The old position of the wafer support 928 is shown in a light grey dotted outline for reference. As with FIG. 9, the center location 938 of the wafer 936 relative to the AWC system 942 may be determined by the AWC system 942 as the wafer passes through the AWC system 942.

Figure 14:
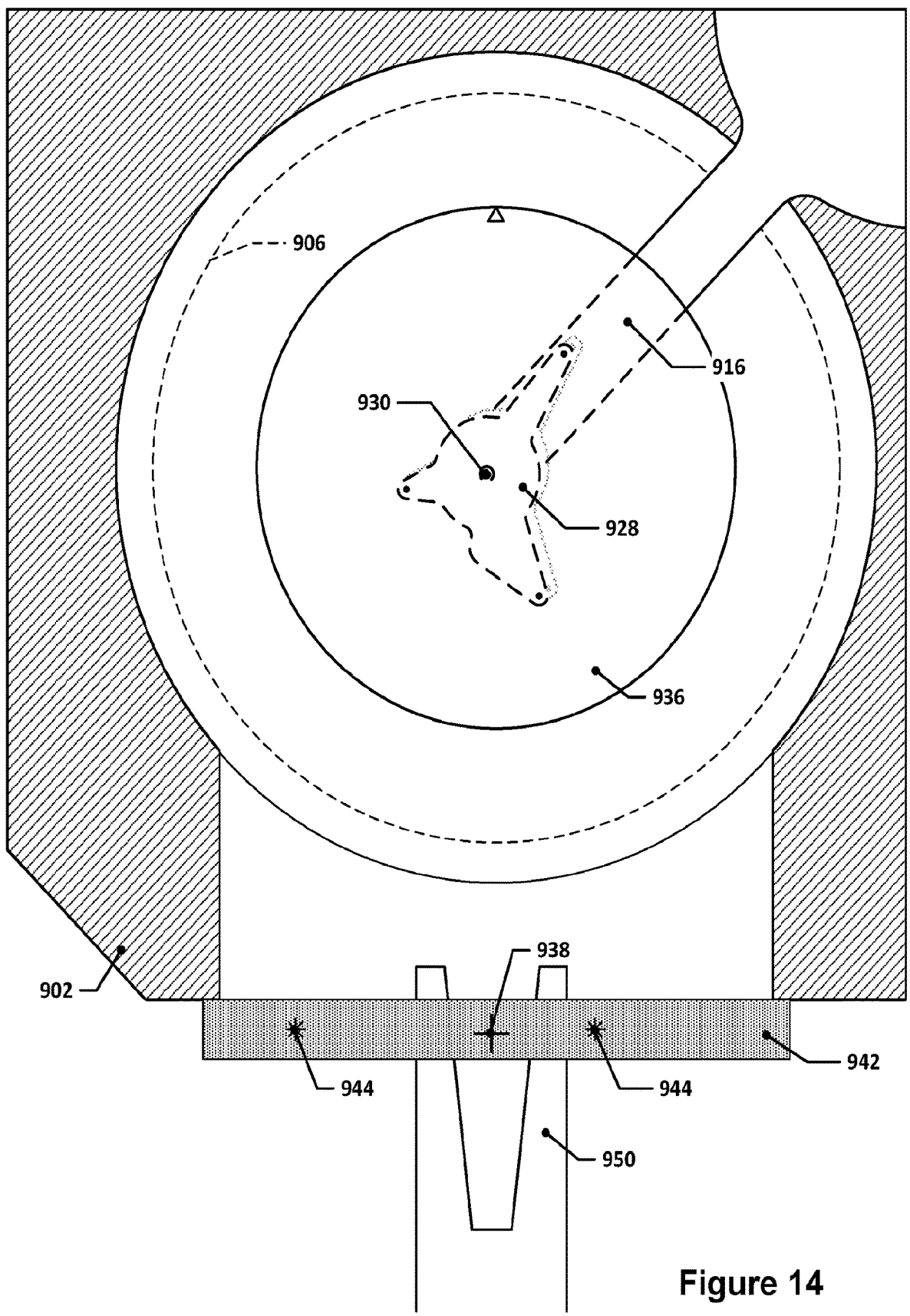
Figure 15:
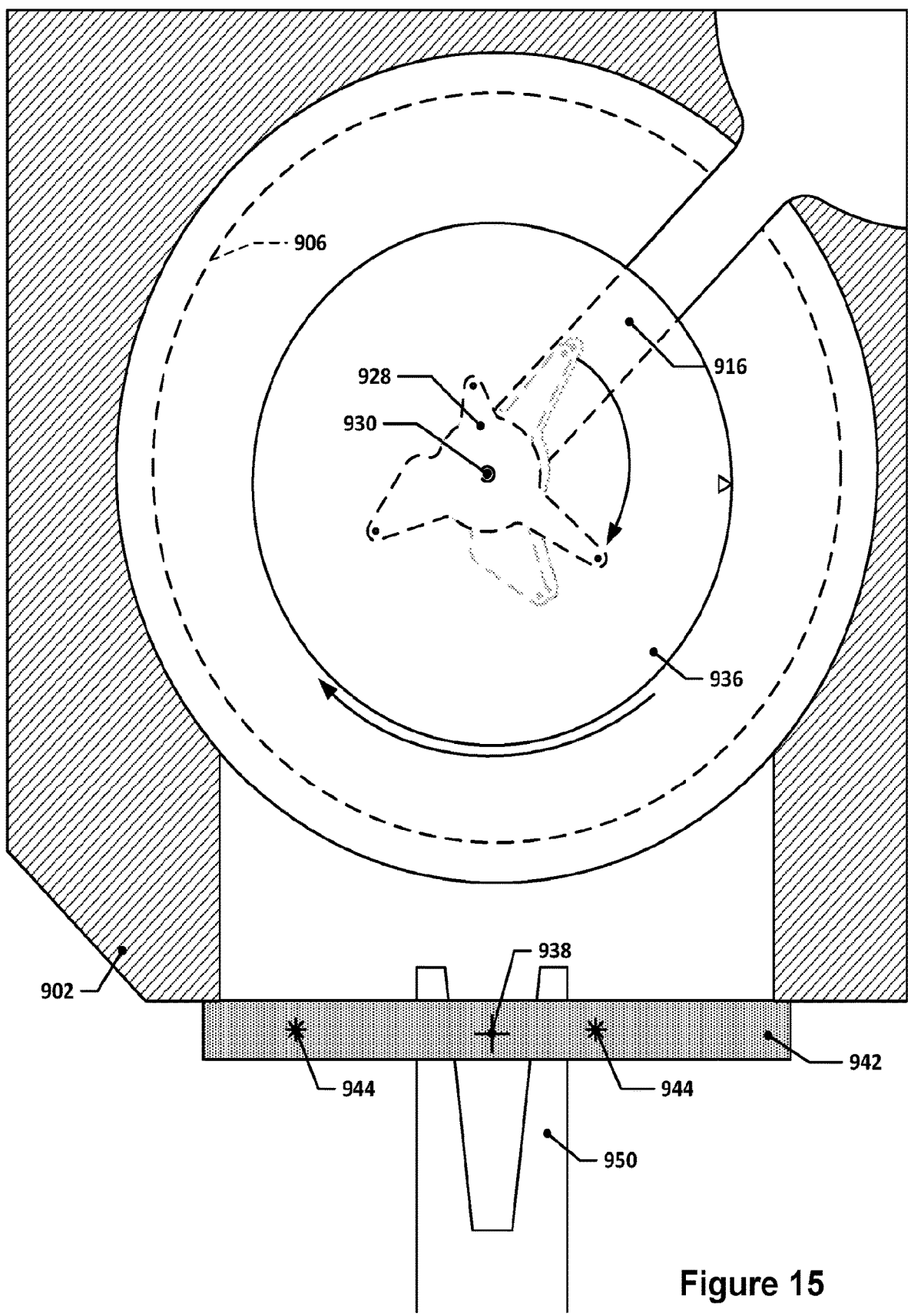
Figure 16:
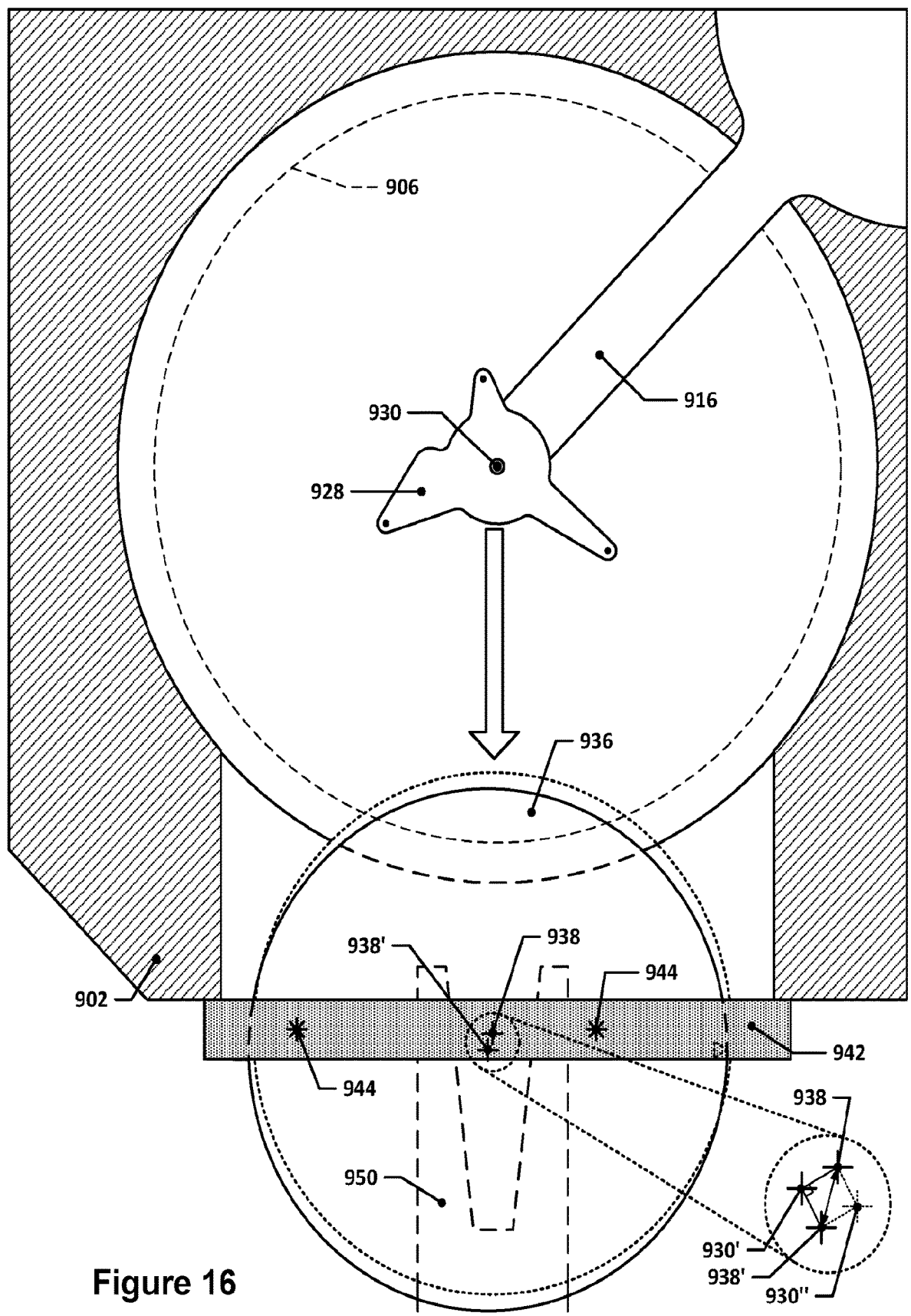

As in FIG. 10, the wafer 936 may be placed on the wafer support 928, as shown in FIG. 14, and the wafer support 928 may then be rotated about the axis of rotation 930 relative to the indexer arm 916 by a predetermined amount, as shown in FIG. 15, thereby causing the wafer 936 to rotate about the axis of rotation 930 by the same amount, e.g., 90°. After such rotation, the end effector 950 may be caused to retrieve the wafer 936 from the wafer support 928 and pass it through the AWC system 942 to obtain a second measurement of the horizontal location 938' of the wafer center relative to the AWC system 942, as shown in FIG. 16. Due to the fact that the center of the wafer 936 and the axis of rotation 930 of the wafer support 928 were not aligned, the rotation of the wafer 936 about the axis of rotation 930 causes the center of the wafer 936 to displace, as evidenced by the shift in location of the horizontal location 938' of the center of the wafer 936 post-rotation as compared with the horizontal location 938 of the center of the wafer 936 pre-rotation.

As can be seen in the detail view of the pre-/post-rotation horizontal locations 938/938' of the center of the wafer 936 in the lower right, two potential solutions for the horizontal location of the axis of rotation (930' and 930") relative to the horizontal locations 938 and 938' of the center point are shown—each of the solutions is equidistant from both horizontal locations 938/938' of the center of the wafer 936, and the included angle between lines joining the horizontal locations 938/938' of the center of the wafer 936 to each of the potential solutions 930' and 930" is the same as the angle of rotation that the wafer 936 experienced, e.g., 90° in this example. If one takes into account the direction of the rotation that the wafer 936 experienced, e.g., clockwise in this example, it becomes apparent that the horizontal location 930' of the axis of rotation is the only solution of the two potential solutions that is valid. Once the location of the axis of rotation 930' of the wafer support 928 relative to the AWC system 942 is known, the wafer support offset may be determined based on the horizontal location of the axis of rotation 930' relative to the "taught" horizontal location that serves as the default starting point for each wafer placement operation.

This technique is similar in nature to the technique discussed in U.S. patent application Ser. No. 16/000,734, which is hereby incorporated herein by reference in its entirety and for all purposes. While U.S. patent application Ser. No. 16/000,734 is generally directed at techniques for determining the location of the axis of rotation for a "lift-pad" or "twist-pad" type wafer rotation device (which is a wafer support that rises up out of a pedestal, lifts a wafer, rotates it, and then sets the wafer down on the same pedestal again) and an appropriate offset that may be used to place a wafer on such a twist-pad type, the techniques in question may be used with other mechanisms that may be used to rotate a wafer about its own axis, e.g., an indexer that has rotatable wafer supports located at the ends of its indexer arms.

Once a wafer support offset is determined, it may be stored in association with the information identifying the indexer arm/wafer support for which it was determined and/or with information indicating the rotational position of the indexer associated with that wafer support offset, e.g., the rotational position the indexer was in when the calibration wafer was placed on and removed from the wafer support (which will determine which indexer arm/wafer support will be positioned underneath the wafer). In the case of twist-pad type wafer rotational devices, e.g., where the wafer rotational devices stay fixed in place with respect to the chamber and the indexer rotates relative to the chamber and the wafer rotational devices, the wafer support offsets that are determined are still determined based on the axes of rotation of the wafer rotational devices, but are not each associated with a different indexer arm. In such cases, each wafer support offset that is determined may be stored in association with the pedestal that incorporates such the wafer rotational device associated with the wafer support offset. Thus, for example, if four wafer support offsets are determined, each associated with a different twist-pad type wafer rotational device incorporated into a corresponding pedestal, the wafer support offset associated with a particular destination pedestals may be used to place a wafer on the transfer pedestal when that wafer is destined to be transferred to that particular destination pedestal. Similar techniques may also be used in equipment where the wafer rotational device and the pedestal are one and the same, e.g., where the entire pedestal may be configured to rotate.

Additional discussion of twist-pad type wafer rotation devices may be found in U.S. Pat. Nos. 9,960,068 and 9,892,956, as well as U.S. Pat. Pub. No. 2018/0158716, all of which are hereby incorporated herein by reference in their entirety.

Figure 17:
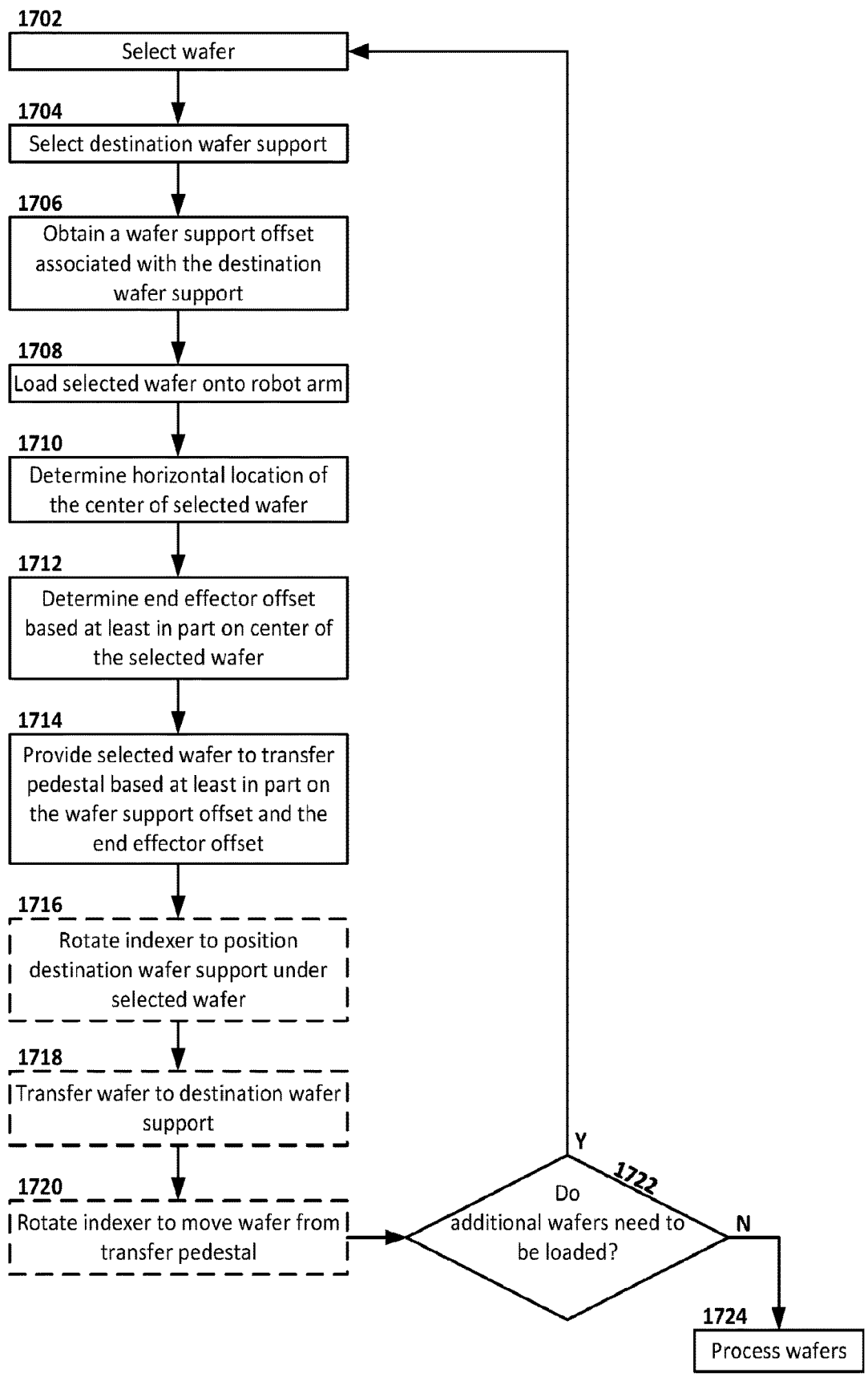
FIG. 17 depicts an example technique for loading wafers in preparation for processing using either such mode.

Once a complete set of wafer support offsets is determined, the multi-station chamber for which the wafer support offsets were determined may be used for normal wafer processing operations involving indexed in-place rotation mode or static in-place rotation mode utilizing the indexer with rotatable wafer supports. FIG. 17 depicts an example technique for loading wafers in preparation for processing using either such mode.

In FIG. 17, the technique may begin with block 1702, where a wafer may be selected for loading. In block 1704, the selected wafer may be assigned to a selected destination wafer support/indexer arm of the indexer; the destination wafer support/indexer arm is the wafer support/indexer arm that will generally support the wafer during rotation of the wafer relative to the indexer arm and/or movement of the wafer between stations. As discussed earlier, the destination wafer support/indexer arm in such processing modes will generally stay the same for a wafer for the duration of the wafer's residence time in the multi-station chamber.

In block 1706, a wafer support offset corresponding to the selected wafer support/indexer arm of the indexer may be obtained, e.g., by looking up the wafer support offset in a database that associates each wafer support offset with a corresponding indexer arm/wafer support of the indexer. In block 1708, the selected wafer may be loaded onto the end effector of a wafer handling robot and then, in block 1710, the horizontal location of the center of the selected wafer may be determined relative to the AWC system of the multi-station chamber and, in block 1712, an end effector offset for the selected wafer may be determined based, at least in part, on the horizontal location of the center of the selected wafer relative to the AWC system.

Once the end effector offset for the selected wafer has been determined and the appropriate wafer support offset for the selected indexer arm/wafer support has been obtained, the wafer handling robot may be controlled in block 1714 to provide the selected wafer to the transfer pedestal of the multi-station chamber (this assumes that the multi-station chamber has only a single transfer station; multi-station chambers with multiple transfer pedestals are discussed later below).

In block 1716, the indexer may be optionally rotated to position the selected destination wafer support under the selected wafer. This operation, as well as the operations of blocks 1718 and 1720, may be omitted during the loading process, if desired, for the last wafer to be loaded prior to initiating processing operations on the wafers. Once the selected destination wafer support is positioned underneath the selected wafer, the selected wafer may be transferred to the destination wafer support in block 1718, e.g., by lowering the selected wafer onto the destination wafer support by retracting, for example, lift pins used to support the selected wafer above the transfer pedestal. The indexer may then be caused, in block 1720, to rotate the selected destination wafer support and the selected wafer supported thereby to a position where the selected wafer will not interfere with the provisioning of additional wafers to the transfer pedestal.

In block 1722, a determination may be made as to whether additional wafers need to be loaded into the multi-station chamber. If no further wafers need to be loaded into the multi-station chamber, the technique may proceed to block 1724, where wafer processing operations may begin. If further wafers need to be loaded into the multi-station chamber, then the technique may return to block 1702, where a different wafer may be selected and the technique repeated.

As with the pedestal offsets, if multiple process conditions are expected to be commonly encountered during various wafer loading operations, a separate set of wafer support offsets may be determined for each of the process conditions, thereby allowing the wafers to be accurately placed on the wafer supports of the indexer regardless of which particular process condition of the process conditions is applicable. Furthermore, if multiple transfer pedestals are provided in a multi-station chamber, there may be a different AWC system and a different set of wafer support offsets associated with each transfer pedestal. Thus, in a four-station system with two transfer pedestals and a 4-arm indexer, there would be, in association with a given process condition, eight sets of wafer support offsets—one for each indexer arm/wafer support of the indexer for wafers to be provided to the first transfer pedestal, and one for each indexer arm/wafer support of the indexer for wafers to be provided to the second transfer pedestal.

The uniformity benefits of using the wafer placement techniques discussed above are discussed in more detail below with regard to FIGS. 18 through 21. Each of FIGS. 18 through 21 depicts a multi-station chamber 1802 with four stations (stations 1, 2, 3, and 4, starting with station number 1 in the lower left corner and proceeding incrementally clockwise).

Figure 18:
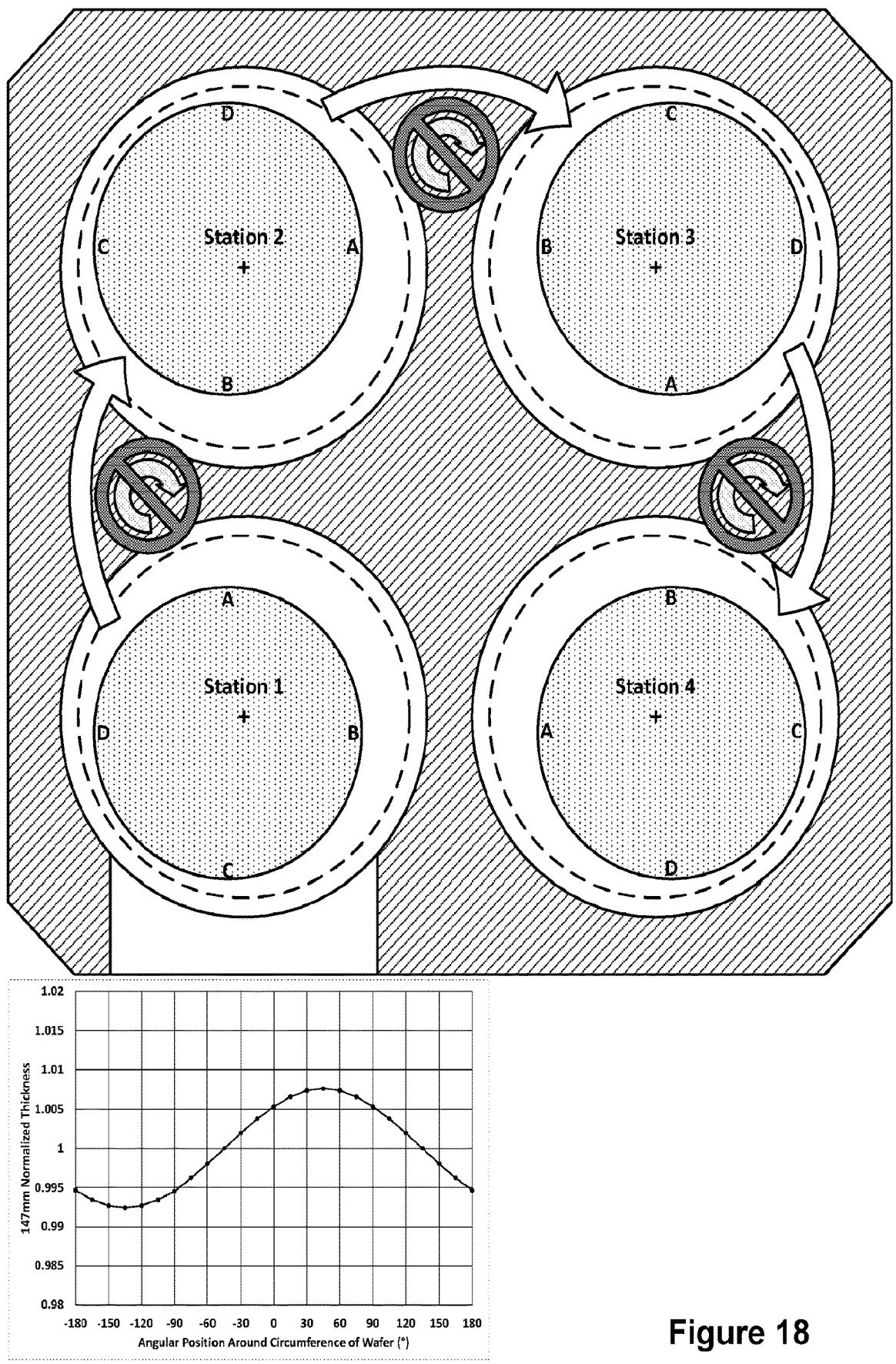
FIGS. 18 through 21 depict a chamber in various processing mode scenarios along with representative wafer uniformity data associated with such scenarios.

FIG. 18 depicts the chamber 1802 in a traditional indexing mode where wafers 1836 may be transferred from station to station by an indexer (not shown) that does not independently rotate the wafers relative to the indexer arms (in FIGS. 18 through 21, station-to-station movement is indicated by large arrows in between stations, whereas the smaller, tight-radius arrows in between stations indicate rotation of wafers in between processing phases at different stations relative to the indexer arms that support them or, if indicated by a circle-bar symbol, the lack of such rotation). Thus, the wafers will stay at the same generally radial orientation, e.g., with the same side (such as the arcuate edge between points A and B on each wafer) positioned closest to the center of rotation of the indexer, regardless of which station they are currently positioned in or moved to. As a result, misalignment between the wafer centers and the pedestal centers (such as the depicted misalignment, which has been exaggerated to make it easily perceivable) may result in a wafer non-uniformity such as that shown in the chart of FIG. 18.

Figure 19:
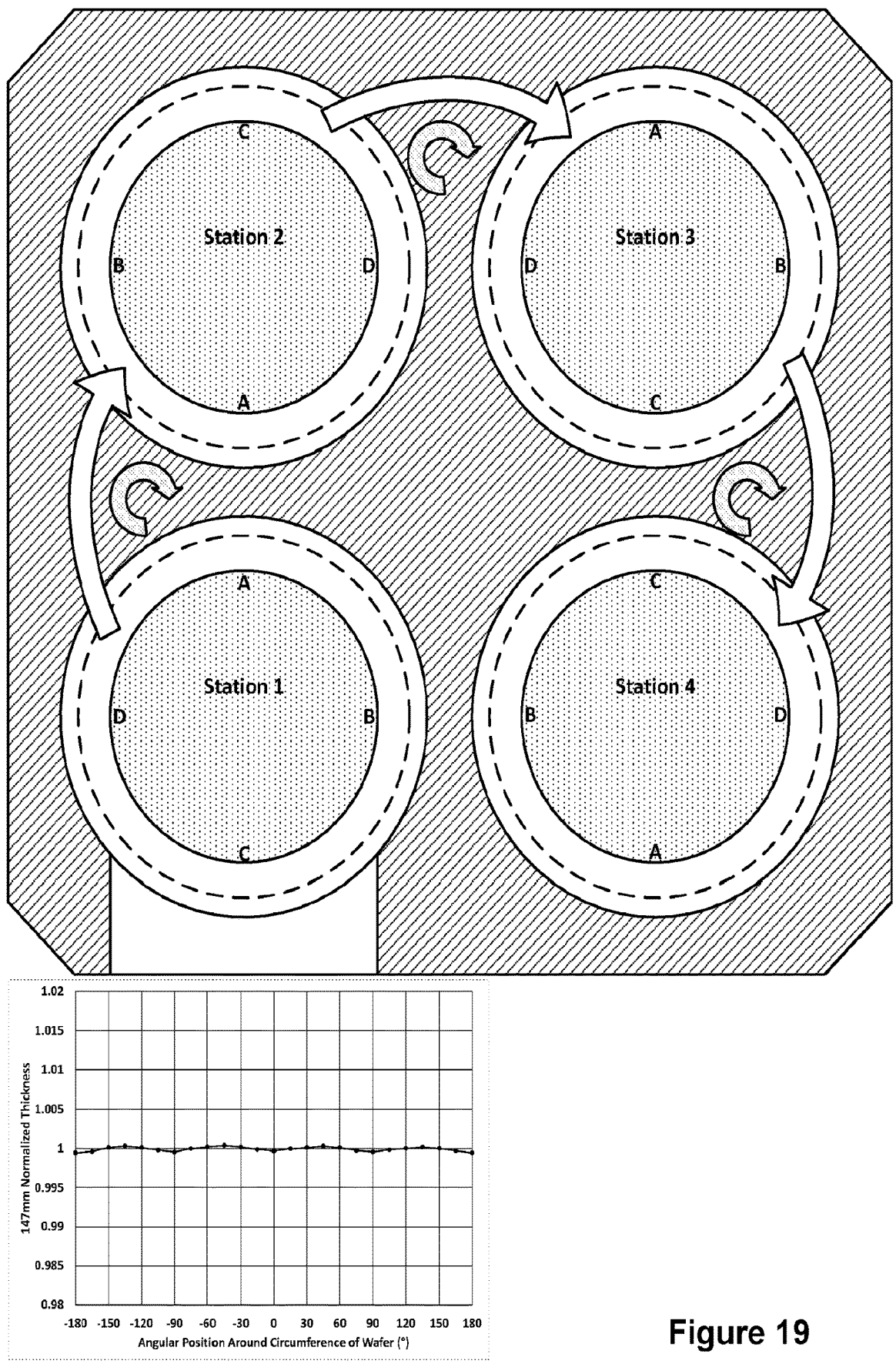

FIG. 19 depicts the chamber 1802 in an indexed in-place rotation mode where the wafers 1836 have all been provided to the transfer pedestal such that each wafer center was perfectly or nearly perfectly centered on the rotational axis of the wafer support of the indexer arm used to transport that wafer to pedestals in the multi-station chamber, e.g., using an appropriate wafer support offset; additionally and such that the pedestal centers and the rotational axes of the wafer supports are all perfectly or nearly perfectly positioned such that the rotational axes of all of the wafer supports may be aligned, in the horizontal plane, with the centers of corresponding pedestals simultaneously. Thus, the center of each wafer may be generally perfectly aligned with the center of each pedestal, regardless of to which pedestal the wafer is moved. Such a scenario can occur if, for example, the pedestal offsets and the wafer support offsets all turn out to be identical or nearly identical. As can be seen in the chart at the bottom of FIG. 19, this results in a very uniform circumferential wafer thickness which results, in this case, from each wafer being perfectly or nearly perfectly centered on each pedestal during each phase of processing and. Furthermore, whatever small nonuniformities might develop may be averaged out through all four quadrants of each wafer as each wafer is moved from one station to the next and also rotated relative to the indexer arms in between each processing phase.

Figure 20:
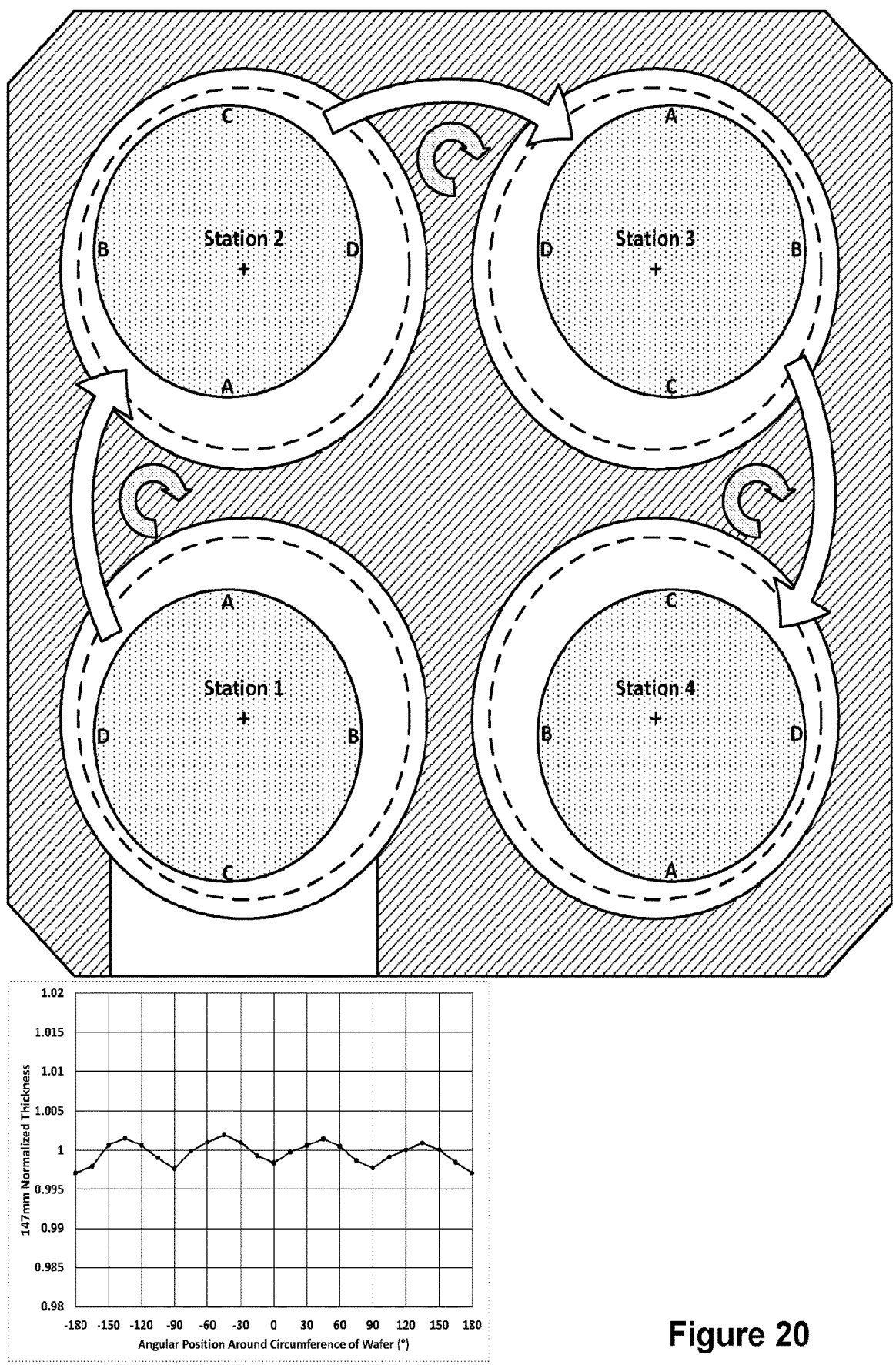

FIG. 20 depicts a more likely scenario for indexed rotation mode in which each wafer was provided to the transfer pedestal using a wafer support offset for a selected indexer arm, thereby aligning the center of each wafer with the axis of rotation of a respective wafer support, but the axes of rotation of the wafer supports may not be able to be perfectly aligned with the centers of the pedestals. This may occur because the indexer arms and the multi-station chamber may undergo different amounts of thermal expansion, for example, such that it is simply not possible to attain the perfect alignment depicted in FIG. 19. Thus, each wafer may be rotated relative to the indexer arms by the in-place rotation mechanism of the indexer in between each processing phase, which may act to average out any pedestal-related non-uniformity without causing "wandering" of the center of a wafer relative to the axis of rotation of the wafer support selected for that wafer from its original positioning relative to the axis of rotation. The result, as can be seen from the chart in the lower left corner of the Figure, is that the wafer uniformity, while not as uniform as for the ideal case of FIG. 19, is still much improved as compared to the traditional indexing mode of FIG. 18.

Figure 21:
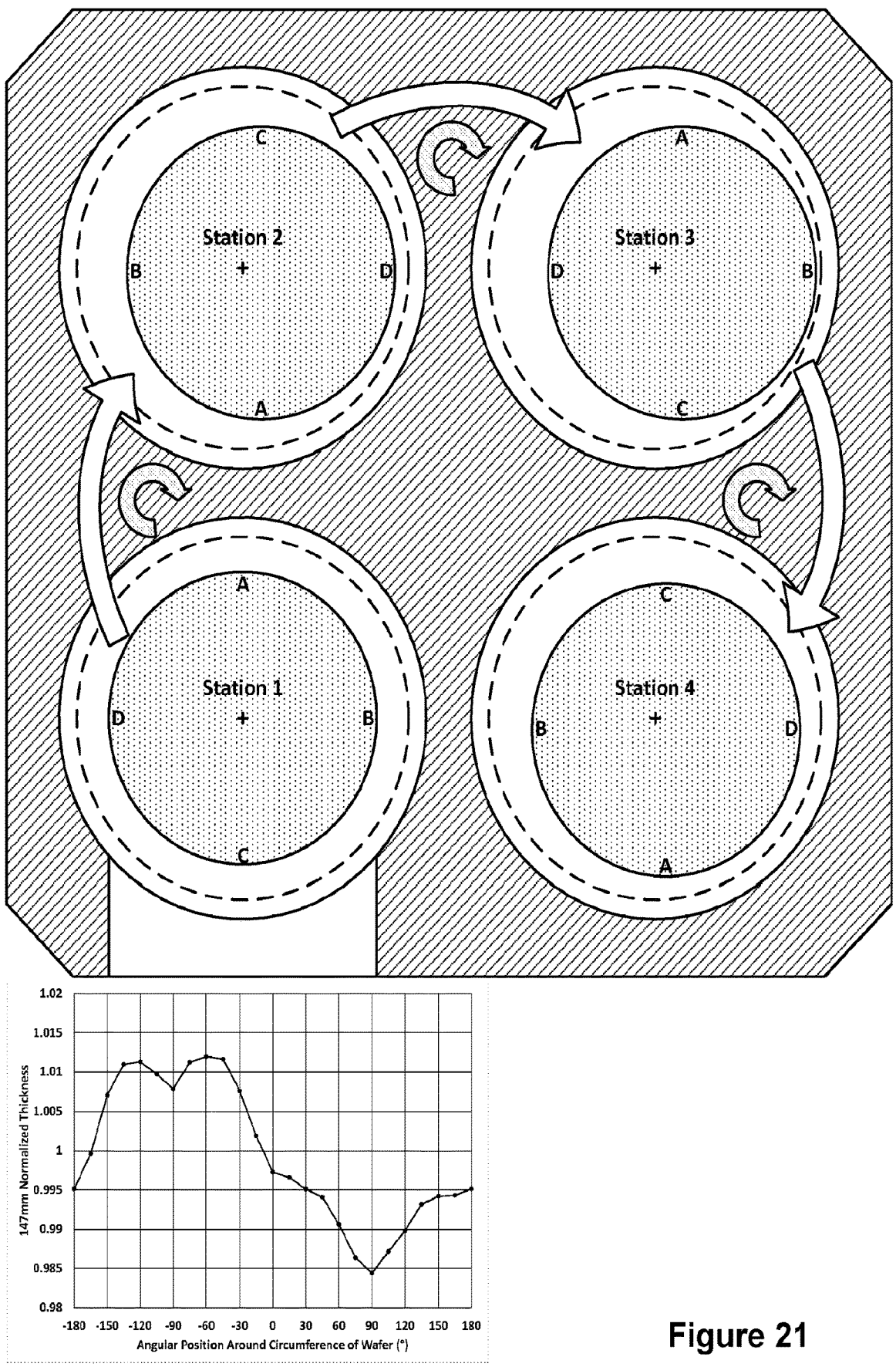

FIG. 21 depicts the chamber 1802 in an indexed rotation mode where the wafer was not subjected to a wafer support offset prior to being provided to the transfer pedestal. As a result, the center of the wafer is not aligned with the axis of rotation of the wafer support selected for that wafer, which causes the wafer to "wander" from whatever its starting positioning was relative to the axis of rotation with each transfer from one station to the next. This causes the uniformity of the wafer to exhibit a pronounced non-uniformity as compared with that observed with respect to FIG. 20, demonstrating the benefit of the above-described technique.

It will be understood that the above techniques may also be implemented in a manner such that the use of pedestal offsets and/or wafer support offsets may not be immediately apparent. For example, whereas the above discussions have focused on applying the pedestal offset or wafer support offsets to a common "starting point," such as the center point of a calibration wafer used during teaching of the wafer handling robot (as determined by the AWC system), that may serve as a frame of reference for each wafer placement and then be adjusted using an appropriate end effector offset in conjunction with the appropriate pedestal offset or wafer support offset in order to properly place a wafer in preparation for transfer to a particular pedestal or indexer wafer support, the above techniques may also be implemented, for example, by using multiple pedestal-specific or wafer support-specific starting points/frames of reference and simply selecting an appropriate such starting point or frame of reference to use when determining a particular wafer placement. It will be understood, however, that such a technique nonetheless uses, inherently, the concept of pedestal offsets and/or wafer support offsets. Each such pedestal-specific or wafer support-specific starting point/frame of reference would be offset in some manner from a common frame of reference, e.g., a point in a coordinate system that is fixed in space relative to the multi-station chamber; this offset would correspond to a pedestal offset or wafer support offset, depending on the nature of the starting point/frame of reference in question. Thus, the values stored for the pedestal-specific or wafer support-specific starting points/frames of reference that would be looked up and used to guide the placement of each wafer would already, in effect, have the corresponding pedestal offset or wafer support offset applied. Thus, any placement of a wafer based on such pedestal-specific or wafer support-specific starting points/frames of reference would inherently also be based on a corresponding pedestal offset or wafer support offset, as appropriate.

It will also be understood that the various techniques discussed herein generally involve determining wafer positions and various other positional information relative to a frame of reference that is external to the multi-station chamber, such as a frame of reference that is based on the AWC system, for example, and that such positional information is then, in effect, translated by movements of the wafer handling robot, which may be very precisely controlled so as to perform, in effect, the same translation operations for each wafer placement (although potentially modified based on the various offsets that may be applied). For example, if the default translation operation undertaken by the wafer handling robot would cause a reference point that is fixed with respect to the end effector of the wafer handling robot to translate along a horizontal Y axis by +400 mm with no translation along a horizontal X axis when moving to provide a wafer to the transfer pedestal, then the wafer handling robot would perform such translation with every wafer placement operation where no end effector offset, pedestal offset, wafer support offset, or other offset is used. If, however, an end effector offset of −2 mm in the X direction and +3 mm in the Y direction is determined to be needed, coupled with a pedestal offset of +1 mm in the X direction and −2 mm in the Y direction, then the wafer handling robot could potentially perform three discrete (X,Y) translation operations, e.g., (0 mm, 400 mm), followed by (−2 mm, 3 mm), followed by (1 mm, −2 mm) (although any order of such translations may be pursued—the end result is the same). Alternatively, the a new displacement vector may be calculated and used that is the sum of these displacements, e.g., (1 mm, 401 mm). Generally speaking, coordinates determined by the AWC system, or based on such coordinates, will need to be translated into corresponding locations in the multi-station chamber associated with the transfer pedestal in order to properly locate wafers within the multi-station chamber.

The selection of the particular initial frame of reference used may be somewhat arbitrary—in the examples above, the frame of reference is established based on data points obtained during a wafer handling teaching operation, but it will be understood that any of a number of frames of reference may be used, as long as they are fixed with respect to the system used to obtain measurement of the horizontal locations of the centers of the wafers during both calibration and actual wafer loading operations in preparation for processing.

Semiconductor processing tools that include multi-station chambers such as are discussed herein may include a controller that may include one or more processors and one or more memory devices that are operatively connected with one another and that may be configured to control various aspects of operation of the semiconductor processing tool, including, for example, the movement of the wafer handling robot, the operation of the AWC system to obtain measurement points from wafers passed therethough, the operation of lift pins, indexers, and other equipment, e.g., twist pads, rotatable wafer supports on the indexer, etc., that may be within each multi-station chamber. Such a controller may, for example, store computer-executable instructions in the one or more memory devices for controlling the one or more processors to perform any of the techniques discussed herein, including, for example, causing the semiconductor processing tool to perform processing within a multi-station chamber in any of the operational modes discussed herein, and to also select appropriate pedestal offsets or wafer support offsets for a given wafer placement depending on which operational mode is selected. Such controllers may also be configured with computer-executable instructions for controlling the one or more processors to perform some or all of the calibration processes discussed herein that may be used, in some instances, to determine the pedestal offsets and/or the wafer support offsets.

For example, in the case of determining the wafer support offsets, the controller may be configured to perform all of the operations discussed with respect to FIG. 8, as such a technique may be performed using data from the AWC system and the positioning sensors of the indexer arm and wafer handling robot and may not benefit from the use of any external equipment. In the case of determining pedestal offsets according to the technique of FIG. 5, however, the controller may be configured to only perform some of the operations of FIG. 5. For example, obtaining wafer uniformity measurements of sufficient resolution to allow for an estimate of a suitable pedestal offset to be determined may require metrology instrument that would normally not be included as a piece of standard equipment in such a tool due to cost. In such a case, the metrology tool may be a separate piece of equipment that may be moved from tool to tool, or located in a laboratory, and used to separately evaluate the uniformity of the wafer. The data from the uniformity measurement may be fed directly to the controller to allow the controller to then determine the relevant pedestal offset, or the pedestal offset may be determined elsewhere, e.g., by the metrology tool or another computing device that may have access to the uniformity data that is obtained. In such a case, the controller may simply be provided with information indicating the desired pedestal offset after such information is obtained.

Figure 22:
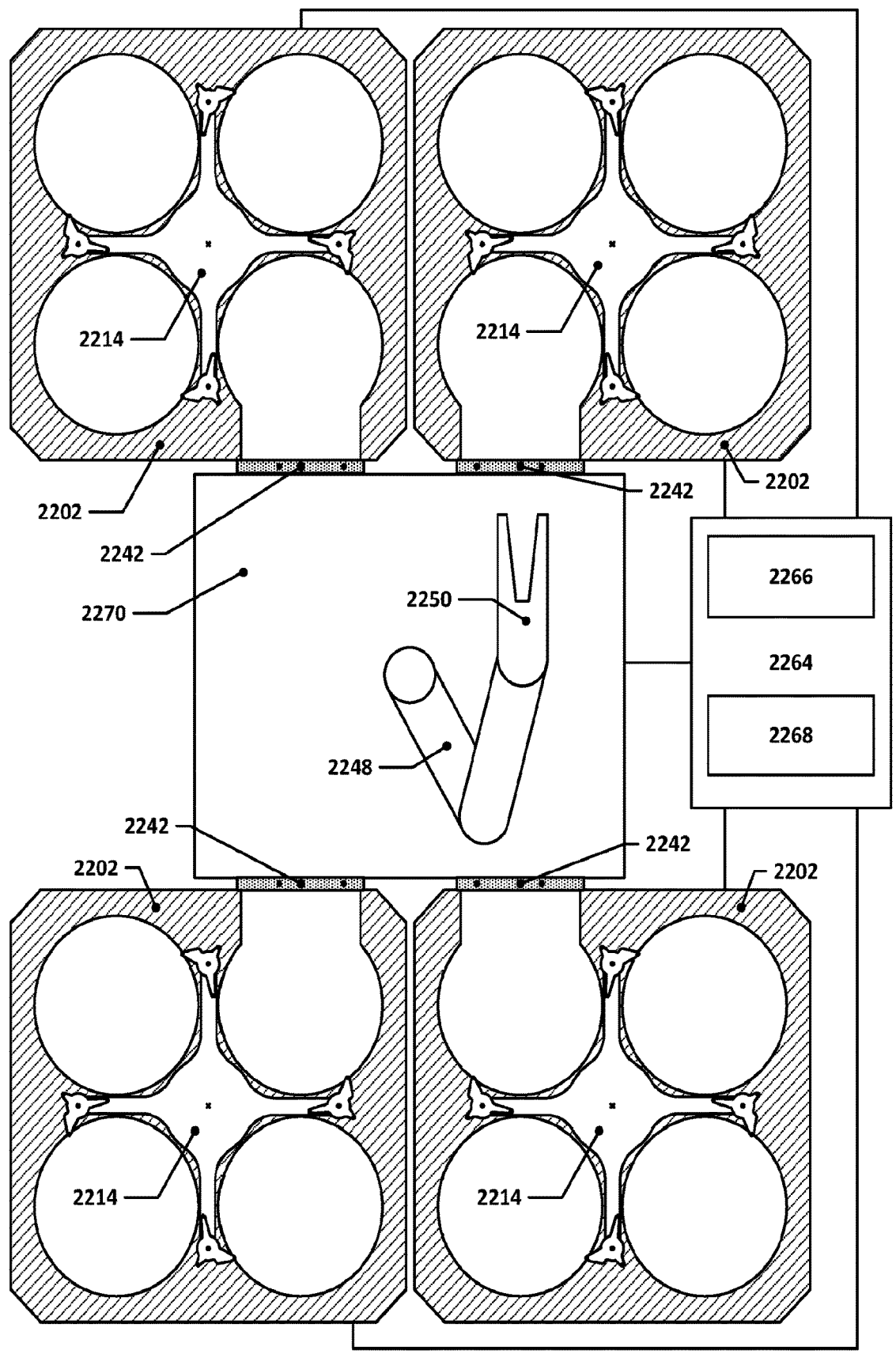
FIG. 22 depicts an example of a multi-chamber tool.

It will be further understood that the techniques used for multi-station chambers discussed herein may also be implemented in tools that include multiple multi-station chambers. FIG. 22 depicts an example semiconductor processing tool with multiple multi-station chambers. In FIG. 22, the semiconductor processing tool depicted includes four multi-station chambers 2202, each of which has four stations/pedestals (the pedestals are not shown, but may be similar to other pedestals shown herein) circularly arranged about an indexer 2214. One of the pedestals/stations in each chamber 2202 may be designated as a transfer pedestal/transfer station and may be configured to receive or provide wafers from or to a wafer handling robot having a robot arm 2248 and an end effector 2250 and located with a transfer chamber 2270 that may be connected with each chamber 2202 in a manner that allows wafers to be passed into each chamber 2202 via an opening therein. Each chamber 2202 may have an AWC system 2242 that may be used by a controller 2264 to obtain wafer center measurements as wafers transit through the AWC system 2242. The controller 2264 may, as discussed earlier, have one or more processors 2266 and one or more memory devices 2268, which may be operatively connected with one another and with the various pieces of equipment discussed above. In such an implementation, there may also be multiple robot arms so that wafers may be provided to multiple transfer pedestals at once.

As noted above, the controller may be part of a system that may include semiconductor processing equipment, including a processing tool or tools, chamber or chambers, platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, as well as various parameters affecting semiconductor processing, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The term "wafer," as used herein, may refer to semiconductor wafers or substrates or other similar types of wafers or substrates.

It is also to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
a first chamber having an indexer and N pedestals in a circular array centered around a rotational axis of the indexer, wherein a pedestal of the N pedestals of the first chamber is a transfer pedestal, each pedestal of the first chamber is configured to support a wafer, N is an integer greater than one, the first chamber includes an active wafer centering system associated with the transfer pedestal, and the first chamber is a multi-station semiconductor processing chamber;
a wafer handling robot having a robot arm configured to provide individual wafers to the transfer pedestal of the first chamber; and
a controller that includes one or more processors and one or more memory devices, wherein:
the one or more processors, the one or more memory devices, the wafer handling robot, the indexer of the first chamber, and the active wafer centering system of the first chamber are operably connected with each other, and
the one or more memory devices store computer-executable instructions for controlling the one or more processors to:
a) select one of the N pedestals of the first chamber as a destination pedestal of the first chamber for a first wafer;
b) select a first pedestal offset associated with the destination pedestal of the first chamber from a set of N pedestal offsets of the first chamber, each pedestal offset of the set of N pedestal offsets of the first chamber associated with a different pedestal of the N pedestals of the first chamber;
c) obtain information from the active wafer centering system of the first chamber indicative of a horizontal location of the center of the first wafer while the first wafer is on the robot arm;
d) determine a first end effector offset associated with the first wafer based, at least in part, on the information obtained from the active wafer centering system of the first chamber indicative of the horizontal location of the center of the first wafer;
e) cause the robot arm to provide the first wafer to the transfer pedestal of the first chamber based on the first pedestal offset and the first end effector offset;
f) the indexer of the first chamber to move the first wafer from the transfer pedestal of the first chamber to the destination pedestal of the first chamber; and g) the first chamber to perform one or more semiconductor processing operations on the first wafer on the destination pedestal of the first chamber.

2. The apparatus of claim 1, wherein:
the transfer pedestal of the first chamber is the destination pedestal of the first chamber, and
the one or more memory devices store additional computer-executable instructions for further controlling the one or more processors to cause the first chamber to process the first wafer while the first wafer is on the destination pedestal of the first chamber.

3. The apparatus of claim 1, and the one or more memory devices store additional computer-executable instructions for further controlling the one or more processors to:
perform (a) through (e) for each of N wafers, wherein a different pedestal of the N pedestals of the first chamber is selected as the destination pedestal of the first chamber for each of the N wafers;
cause the indexer of the first chamber to move each wafer of the first through $M^{th}$ wafers of the N wafers to the destination pedestal of the first chamber selected for each wafer of the first through $M^{th}$ wafers, wherein M=N−1 and the transfer pedestal of the first chamber is the destination pedestal of the first chamber for the Nth wafer; and
cause the first chamber to perform one or more semiconductor processing operations on the N wafers while each wafer of the N wafers is supported by the corresponding destination pedestal of the first chamber.

4. The apparatus of claim 1, wherein the one or more memory devices store additional computer-executable instructions for further controlling the one or more processors to:
f) select one of the N pedestals of the first chamber as a destination calibration pedestal of the first chamber for a first calibration wafer;
g) obtain information from the active wafer centering system indicative of a horizontal location of the center of the first calibration wafer;
h) cause the robot arm to provide the first calibration wafer to the transfer pedestal of the first chamber;
i) cause the first chamber to perform a calibration process that includes performing one or more semiconductor processing operations on the first calibration wafer; and
j) obtain a preliminary pedestal offset for the destination calibration pedestal of the first chamber based, at least in part, on information indicative of non-uniformity of the first calibration wafer resulting from the performance of the calibration process in (i) and the horizontal location of the center of the first calibration wafer.

5. The apparatus of claim 4, wherein the one or more memory devices store additional computer-executable instructions for further controlling the one or more processors to cause the indexer of the first chamber to move the first calibration wafer from the transfer pedestal of the first chamber to the destination calibration pedestal of the first chamber in between the performance of (h) and (i).

6. The apparatus of claim 4, wherein the one or more memory devices store additional computer-executable instructions for further controlling the one or more processors to use the preliminary pedestal offset as the pedestal offset for the destination calibration pedestal of the first chamber.

7. The apparatus of claim 4, wherein the one or more memory devices store additional computer-executable instructions for further controlling the one or more processors to:

k) obtain information from the active wafer centering system associated with the transfer pedestal of the first chamber indicative of a horizontal location of the center of a second calibration wafer;
l) Cause the robot arm to provide the second calibration wafer to the transfer pedestal of the first chamber;
m) cause the first chamber to perform the calibration process on the second calibration wafer; and
n) determine the pedestal offset for the destination calibration pedestal based at least in part on information indicative of non-uniformity of the second calibration wafer, the information indicative of non-uniformity of the first calibration wafer, the horizontal location of the center of the first calibration wafer, and the horizontal location of the center of the second calibration wafer.

8. The apparatus of claim 1, wherein one of the N pedestals of the first chamber is a secondary transfer pedestal, the first chamber includes a secondary active wafer centering system associated with the secondary transfer pedestal, the wafer handling robot has an additional robot arm configured to provide individual wafers to the secondary transfer pedestal of the first chamber; and
the one or more memory devices store additional computer-executable instructions for further controlling the one or more processors to:
f) select one of the N pedestals of the first chamber as a destination pedestal of the first chamber for an additional wafer;
g) select a corresponding pedestal offset associated with the destination pedestal of the first chamber from N second pedestal offsets of the first chamber, each pedestal offset of the first chamber associated with a different pedestal of the N pedestals of the first chamber;
h) obtain information from the secondary active wafer centering system of the first chamber indicative of a horizontal location of the center of the additional wafer;
i) determine a second end effector offset associated with the additional wafer based, at least in part, on the information obtained from the secondary active wafer centering system of the first chamber indicative of the horizontal location of the center of the additional wafer; and
j) cause the additional robot arm to provide the additional wafer to the secondary transfer pedestal of the first chamber based on the pedestal offset and the second end effector offset.

9. The apparatus of claim 1, further comprising:
a second chamber having an indexer and R pedestals in a circular array centered around a rotational axis of the indexer, wherein one of the R pedestals of the second chamber is a transfer pedestal of the second chamber, each pedestal of the second chamber is configured to support a wafer, R is an integer greater than one, the second chamber includes an active wafer centering system associated with the transfer pedestal of the second chamber, and the second chamber is a multi-station semiconductor processing chamber;
the one or more processors, the one or more memory devices, the wafer handling robot, the indexer of the second chamber, and the active wafer centering system of the second chamber are operably connected with each other, and
the one or more memory devices store additional computer-executable instructions for further controlling the one or more processors to:

f) select one of the R pedestals of the second chamber as a destination pedestal of the second chamber for an additional wafer;

g) select a corresponding second pedestal offset associated with the destination pedestal of the second chamber from a set of R second pedestal offsets of the second chamber, each second pedestal offset of the second chamber associated with a different pedestal of the R pedestals of the second chamber;

h) obtain information from the active wafer centering system of the second chamber indicative of a horizontal location of the center of the additional wafer;

i) determine a second end effector offset associated with the additional wafer based, at least in part, on the information obtained from the active wafer centering system of the second chamber indicative of the horizontal location of the center of the additional wafer; and j) cause the robot arm to provide the additional wafer to the transfer pedestal of the second chamber based on the second pedestal offset and the second end effector offset.

10. The apparatus of claim 1, wherein:

the indexer arm includes a plurality of indexer arms, each indexer arm is connected to a center hub of the indexer at one end and has a wafer support at the other end that is configured to rotate about a corresponding rotational axis relative to that indexer, and the one or more memory devices store additional computer-executable instructions for further controlling the one or more processors to:

f) select a wafer support from the plurality of wafer supports supported by the indexer arms as a destination wafer support of the first chamber for a second wafer;

g) select a first wafer support offset associated with the destination wafer support of the first chamber from a set of N wafer support offsets, each wafer support offset associated with a different wafer support of the plurality of wafer supports;

h) obtain information from the active wafer centering system of the first chamber indicative of the horizontal location of the center of the second wafer;

i) determine a first end effector offset associated with the second wafer based, at least in part, on the information obtained from the active wafer centering system of the first chamber indicative of the horizontal location of the center of the second wafer; and j) cause the wafer handling robot to provide the second wafer to the transfer pedestal of the first chamber based at least in part on the first wafer support offset and the first end effector offset.

11. The apparatus of claim 1, wherein the one or more memory devices store additional computer-executable instructions for further controlling the one or more processors to, for each pedestal of the N pedestals of the first chamber:

obtain the pedestal offset associated with the pedestal of the first chamber; and store the pedestal offset associated with the pedestal of the first chamber in a data structure that associates each pedestal offset with the corresponding pedestal of the N pedestals of the first chamber.

12. The apparatus of claim 1, wherein N equals four.

13. The apparatus of claim 1, wherein the one or more memory devices store additional computer-executable instructions for further controlling the one or more processors to:

determine a process condition for the chamber, and perform (b) by selecting the first pedestal offset associated with the destination pedestal of the first chamber from a set of N pedestal offsets of the first chamber that is associated with the process condition, wherein there are multiple sets of N pedestal offsets of the first chamber, each associated with a different process condition.

14. An apparatus comprising:

a first chamber having an indexer and N pedestals in a circular array centered around a rotational axis of the indexer, wherein a pedestal of the N pedestals of the first chamber is a transfer pedestal, each pedestal of the first chamber is configured to support a wafer, N is an integer greater than one, the first chamber includes an active wafer centering system associated with the transfer pedestal, the first chamber is a multi-station semiconductor processing chamber, and the indexer has N indexer arms, each indexer arm having i) a proximal end connected with a central hub configured to rotate about a first axis and ii) a distal end supporting a wafer support that is configured to rotate about a corresponding second axis relative to that indexer arm;

a wafer handling robot having a robot arm configured to provide individual wafers to the transfer pedestal of the first chamber; and a controller that includes one or more processors and one or more memory devices, wherein:

the one or more processors, the one or more memory devices, the wafer handling robot, the indexer of the first chamber, and the active wafer centering system of the first chamber are operably connected with each other, and the one or more memory devices store computer-executable instructions for controlling the one or more processors to:

a) select a wafer support from the plurality of wafer supports supported by the indexer arms as a destination wafer support of the first chamber for a first wafer;

b) select a first wafer support offset associated with the destination wafer support of the first chamber from a set of N wafer support offsets, each wafer support offset associated with a different wafer support of the plurality of wafer supports;

c) obtain information from the active wafer centering system of the first chamber indicative of a horizontal location of the center of the first wafer;

d) determine a first end effector offset associated with the first wafer based, at least in part, on the information obtained from the active wafer centering system of the first chamber indicative of the horizontal location of the center of the first wafer; and e) cause the wafer handling robot to provide the first wafer to the transfer pedestal of the first chamber based at least in part on the first wafer support offset and the first end effector offset.

15. The apparatus of claim 14, wherein the one or more memory devices store additional computer-executable instructions for further controlling the one or more processors to:

f) cause, after (e), the indexer to rotate such that the corresponding second axis of the destination wafer support is aligned with the center of the first wafer, g) cause the first wafer to be placed on the destination wafer support with the center of the first wafer aligned with the second axis of the destination wafer support, h) cause the indexer to rotate, after (g), to move the first wafer from a station of the first chamber having the transfer pedestal to another station of the first chamber having a pedestal other than the transfer pedestal, i) cause the first wafer to be placed on the pedestal of the other station, j) cause the wafer support for the first wafer to rotate about the corresponding second axis relative to the indexer arm supporting the wafer support in between (g) and (i), and k) cause the first chamber to perform one or more semiconductor processing operations on the first wafer while the first wafer is on the pedestal of the other station.

16. The apparatus of claim 14, wherein the one or more memory devices store additional computer-executable instructions for further controlling the one or more processors to, for each wafer of second through Nth wafers:

f) select a wafer support from the plurality of wafer supports supported by the indexer arms as a destination wafer support of the first chamber for that wafer;

g) select a corresponding wafer support offset associated with the destination wafer support of the first chamber for that wafer from the set of N wafer support offsets;

h) obtain information from the active wafer centering system of the first chamber indicative of a horizontal location of a center of that wafer;

i) determine a corresponding end effector offset for that wafer based, at least in part, on the information obtained from the active wafer centering system of the first chamber indicative of the horizontal location of the center of that wafer;

j) cause the wafer handling robot to provide that wafer to the transfer pedestal of the first chamber based at least in part on the corresponding wafer support offset for that wafer and the corresponding end effector offset for that wafer;

k) cause, after (j), the indexer to rotate such that the corresponding second axis of the destination wafer support for that wafer is aligned with the center of that wafer; and l) Cause that wafer to be placed on the destination wafer support for that wafer with the center of that wafer aligned with the second axis of the destination wafer support for that wafer.

17. The apparatus of claim 16, wherein:

each pedestal of the first chamber is associated with a corresponding station of the first chamber, and the one or more memory devices store additional computer-executable instructions for further controlling the one or more processors to:

(m) cause, after (l), the indexer to move, in unison, each of the N wafers from the station of the first chamber that each wafer of the N wafers was in prior to (m) to a station of the first chamber that another of the N wafers was in prior to (m);

(n) cause each of the N wafers to be placed on the pedestal of the station that that wafer was moved to in (m);

(o) cause, in between (l) and (n), the destination wafer support for each of the wafers to rotate the corresponding wafer about the second axis of that destination wafer support relative to the indexer arm supporting that destination wafer support; and (p) cause the first chamber to perform one or more processing operations on the N wafers after (n).

18. The apparatus of claim 17, wherein the one or more memory devices store additional computer-executable instructions for further controlling the one or more processors to:

repeat (l) through (p) one or more times.

19. The apparatus of claim 17, wherein the one or more memory devices store additional computer-executable instructions for further controlling the one or more processors to:

repeat (l) through (p) N or more times.

20. The apparatus of claim 14, wherein the one or more memory devices store additional computer-executable instructions for controlling the one or more processors to:

f) select one of the N wafer supports as a destination calibration wafer support of the first chamber for a first calibration wafer;

g) obtain information from the active wafer centering system indicative of a horizontal location of the center of the first calibration wafer;

h) cause the robot arm to provide the first calibration wafer to the transfer pedestal of the first chamber;

i) cause the indexer to rotate such that the destination calibration wafer support is positioned beneath the first calibration wafer;

j) cause the first calibration wafer to be placed on the destination calibration wafer support;

k) cause the destination calibration wafer support and the first calibration wafer supported thereby to rotate about the corresponding second axis by a first angular amount and in a first direction;

l) Cause the robot arm to retrieve the first calibration wafer from the first chamber;

m) obtain information from the active wafer centering system indicative of an updated horizontal location of the center of the first calibration wafer;

n) determine the wafer support offset for the destination calibration wafer support based, at least in part, on the horizontal location of the center of the first calibration wafer, the updated horizontal location of the center of the first calibration wafer, the first angular amount, and the first direction; and o) store, in a data structure, the wafer support offset for the destination calibration wafer support in association with the wafer support that is the destination calibration wafer support.

21. The apparatus of claim 20, wherein the one or more memory devices store additional computer-executable instructions for controlling the one or more processors to repeat (f) through (o) N−1 times using a different one of the wafer supports as the destination calibration wafer support for each repetition.

* * * * *